US008659286B2

(12) United States Patent
Reynolds

(10) Patent No.: US 8,659,286 B2
(45) Date of Patent: Feb. 25, 2014

(54) APPARATUS FOR CALIBRATED NON-INVASIVE MEASUREMENT OF ELECTRICAL CURRENT

(76) Inventor: Brett S Reynolds, Hudson, NH (US)

( * ) Notice: Subject to any disclaimer, the term of this patent is extended or adjusted under 35 U.S.C. 154(b) by 307 days.

(21) Appl. No.: 13/174,953

(22) Filed: Jul. 1, 2011

(65) Prior Publication Data
US 2012/0001617 A1    Jan. 5, 2012

Related U.S. Application Data

(60) Provisional application No. 61/361,122, filed on Jul. 2, 2010.

(51) Int. Cl.
*G01R 15/18*    (2006.01)

(52) U.S. Cl.
USPC .................. 324/117 R; 324/130; 702/104

(58) Field of Classification Search
USPC ...................................................... 324/117 R
See application file for complete search history.

(56) References Cited

U.S. PATENT DOCUMENTS

| | | | |
|---|---|---|---|
| 4,613,821 A | 9/1986 | Sternberg et al. | |
| 4,625,166 A | 11/1986 | Steingroever et al. | |
| 4,717,872 A | 1/1988 | Wagner et al. | |
| 4,754,218 A | 6/1988 | Wagner et al. | |
| 4,887,027 A | 12/1989 | Strasser | |
| 5,250,894 A | 10/1993 | Bridges et al. | |
| 5,386,188 A | 1/1995 | Minneman et al. | |
| 5,438,256 A | 8/1995 | Thuries et al. | |
| 5,469,067 A * | 11/1995 | Endoh et al. | 324/551 |
| 5,473,244 A | 12/1995 | Libove et al. | |
| 5,570,034 A | 10/1996 | Needham et al. | |
| 5,804,979 A | 9/1998 | Lund et al. | |
| 6,583,613 B1 | 6/2003 | Hohe et al. | |
| 6,714,000 B2 | 3/2004 | Staats | |
| 6,727,682 B1 | 4/2004 | Tobin | |

(Continued)

FOREIGN PATENT DOCUMENTS

| | | |
|---|---|---|
| JP | 2001083188 | 3/2001 |
| WO | 2008150458 A1 | 12/2008 |

OTHER PUBLICATIONS

D'Antona, Gabriele et al., Processing Magnetic Sensor Array Data for AC Current Measurement in Multiconductor Systems, IEEE Transactions on Instrumentation and Measurement, vol. 50, No. 5, Oct. 2001, pp. 1289-1295, 7 pages.

(Continued)

*Primary Examiner* — Arleen M Vazquez
*Assistant Examiner* — Feba Pothen
(74) *Attorney, Agent, or Firm* — Maine Cernota & Rardin

(57) ABSTRACT

A system for accurate measurement and monitoring of AC or DC electrical current flowing through electrical conductors includes one or more current sensors, a receiver, and one or more calibration signal generators ("CSG's") that can be plugged into outlets or otherwise coupled to the conductors so as to add automated, time-varying calibration signals to the conductors, such as current pulses or pulse patterns. The sensors are placed on a circuit breaker panel, around a cable, or otherwise near the conductors. The receiver distinguishes the calibration signals by their timing, pulse patterns, frequencies, or other time-varying features, uses their known amplitudes to calibrate the sensitivity of each sensor to each conductor, and determines the current flowing in each conductor. Among other applications, the invention can monitor building current usage, CO and data center power usage and distribution, and power line current leakage, and can calibrate invasive and/or non-invasive current sensors.

36 Claims, 16 Drawing Sheets

(56) References Cited

U.S. PATENT DOCUMENTS

| | | |
|---|---|---|
| 6,750,544 B1 | 6/2004 | Berkcan |
| 6,750,644 B1 * | 6/2004 | Berkcan .................. 324/117 R |
| 6,771,058 B2 | 8/2004 | Lapinksi et al. |
| 6,854,076 B2 | 2/2005 | Burt et al. |
| 6,894,490 B2 | 5/2005 | Lescourret |
| 6,956,364 B2 | 10/2005 | Staats |
| 7,088,090 B2 | 8/2006 | Staats |
| 7,106,046 B2 | 9/2006 | Nagano et al. |
| 7,164,263 B2 | 1/2007 | Yakymyshyn et al. |
| 7,191,074 B2 | 3/2007 | Rostron et al. |
| 7,227,347 B2 | 6/2007 | Viaro et al. |
| 7,227,348 B2 | 6/2007 | Sorensen |
| 7,279,884 B2 | 10/2007 | Yakymyshyn et al. |
| 7,279,885 B2 * | 10/2007 | Yakymyshyn et al. ... 324/117 R |
| 7,321,226 B2 | 1/2008 | Yakymyshyn et al. |
| 7,397,233 B2 | 7/2008 | Sorensen |
| 7,398,168 B2 | 7/2008 | Lapinski et al. |
| 7,483,803 B2 | 1/2009 | Dorsey et al. |
| 7,528,593 B2 | 5/2009 | Tanizawa |
| 7,571,028 B2 | 8/2009 | Lapinski et al. |
| 7,755,347 B1 | 7/2010 | Cullen et al. |
| 2003/0020454 A1 | 1/2003 | Hauer |
| 2007/0252577 A1 | 11/2007 | Preusse |
| 2008/0312854 A1 | 12/2008 | Chemin et al. |
| 2009/0039868 A1 | 2/2009 | Montreuil |
| 2010/0167659 A1 | 7/2010 | Wagner |
| 2011/0074382 A1 | 3/2011 | Patel |
| 2011/0109306 A1 | 5/2011 | Leeb et al. |
| 2012/0068692 A1 | 3/2012 | Patel et al. |
| 2012/0072143 A1 | 3/2012 | Yogeeswaran et al. |

OTHER PUBLICATIONS

Powerkuff Monitor System, Powerkuff, LLC, website http://www.powerkuff.com, 1 page.

Search Report & Written Opinion for PCT Appl. No. PCT/US2011/042757 dated Dec. 26, 2011, 8 pages.

* cited by examiner

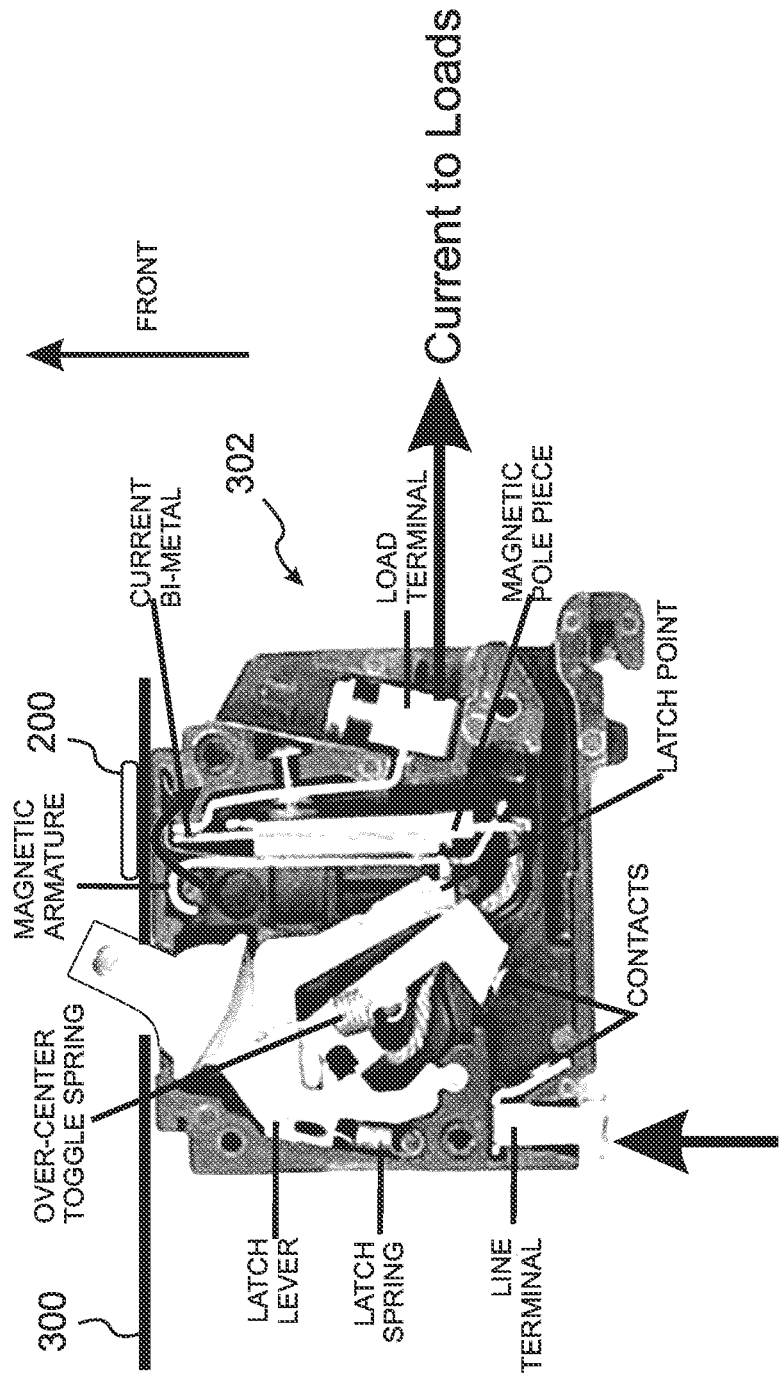

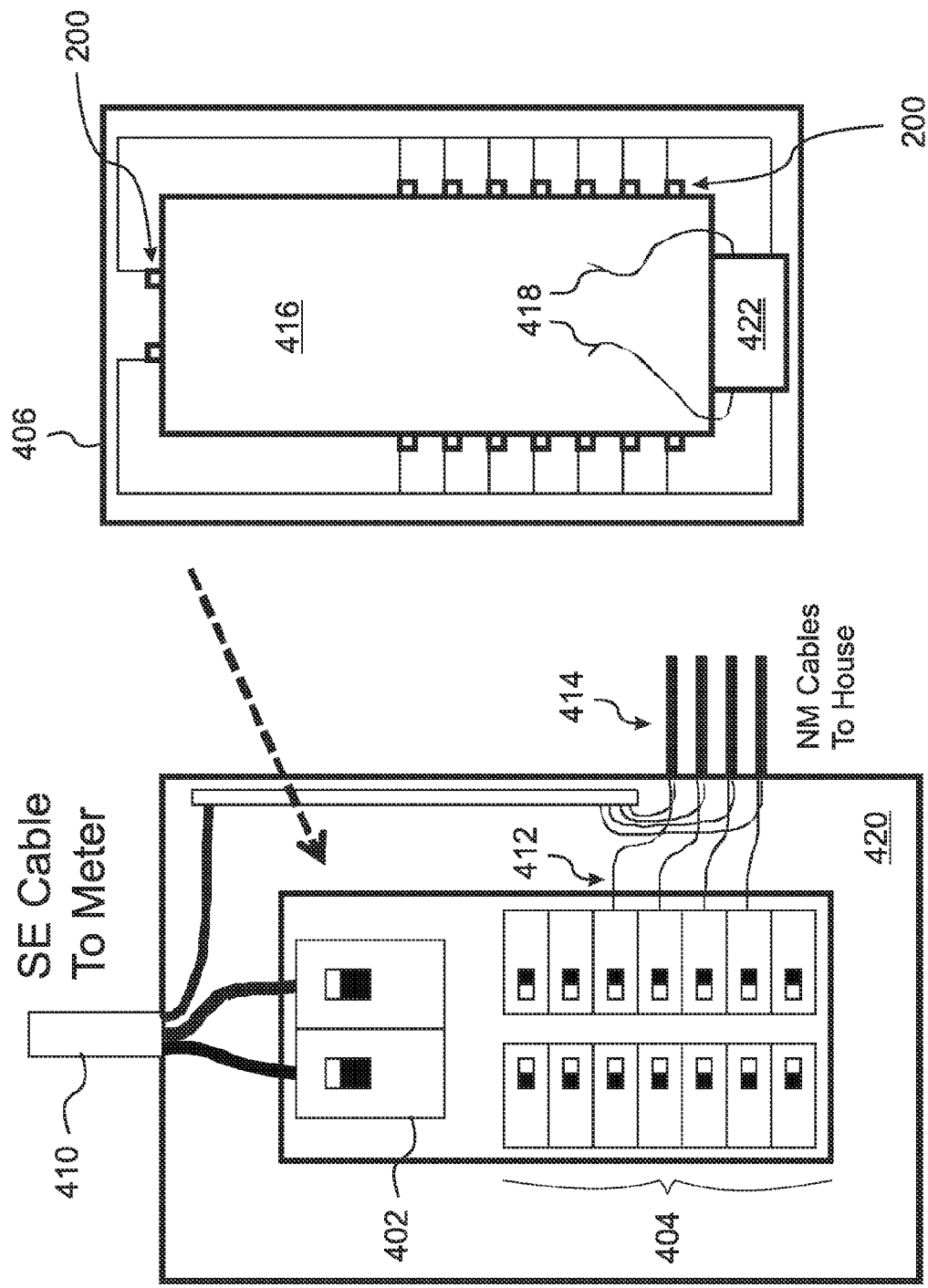

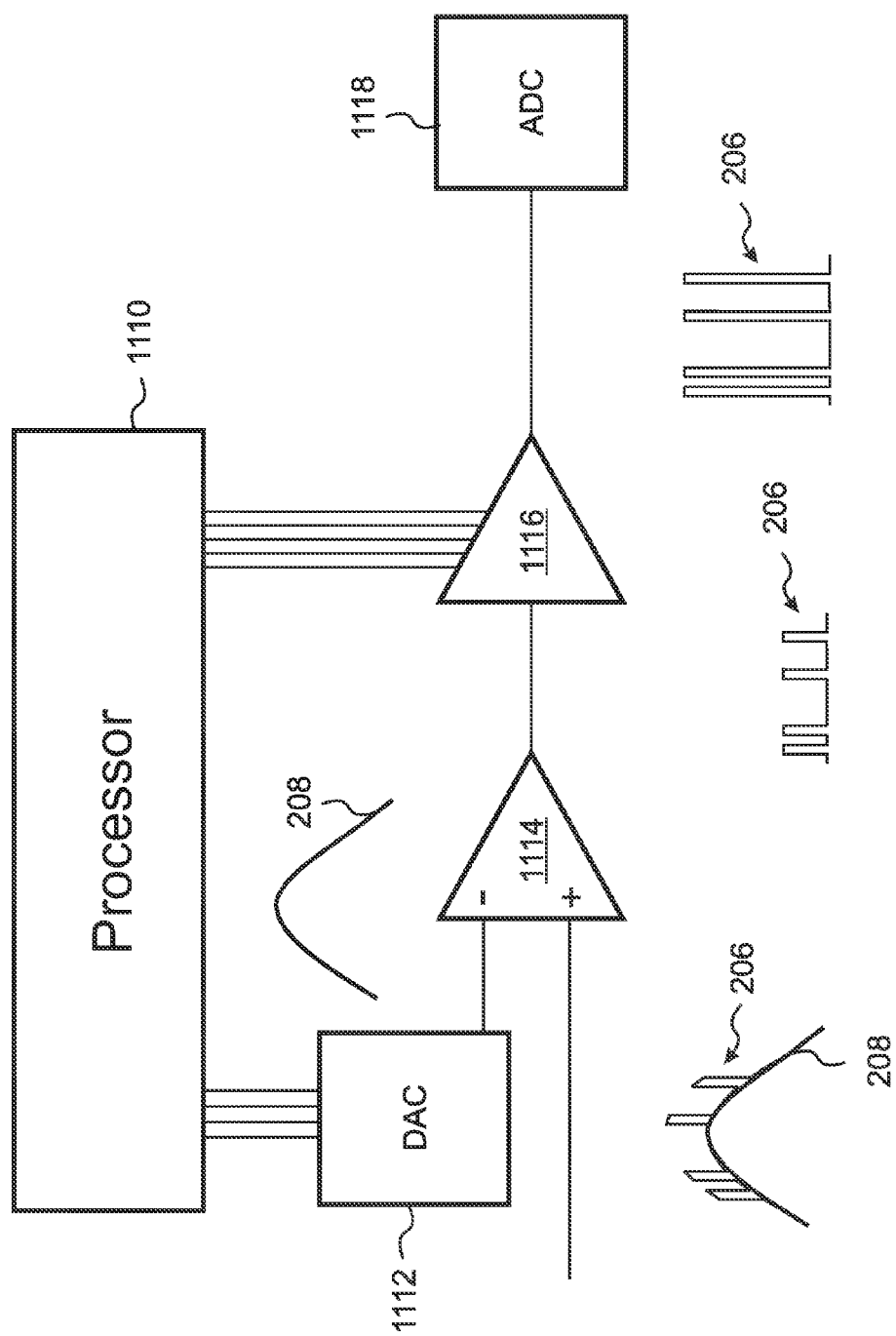

APPARATUS FOR CALIBRATED NON-INVASIVE MEASUREMENT OF ELECTRICAL CURRENT

RELATED APPLICATIONS

This application claims the benefit of U.S. Provisional Application No. 61/361,122, filed Jul. 2, 2010, which is herein incorporated by reference in its entirety for all purposes.

FIELD OF THE INVENTION

The invention relates to electrical measurement apparatus, and more particularly, to apparatus for non-invasive sensing and monitoring of electrical current.

BACKGROUND OF THE INVENTION

Many studies have shown that both household and business consumers can dramatically reduce their power consumption if they can easily and continuously monitor their power usage. Estimates range from 10 to 20 percent savings for a typical household. In addition, many businesses and household consumers are strongly motivated to save energy so as to reduce consumption of hydrocarbons and reduce carbon emissions by reducing the amount of power that must be generated by electricity providers using coal and other hydrocarbon energy sources.

Monitoring of power usage can also be critical to optimizing the efficiency and lowering the energy costs of telecommunication central offices and computer data centers.

As is well known in the field, the electrical power being carried by a conductor is the mathematical product of the voltage on the conductor and the current passing through it. It is generally easy to measure voltage in a system via a contacting means. For example, in a typical building electrical power system voltage can be measured at nearly any electrical outlet, since it is generally the same at all points in the system.

However, it can be very difficult to measure the current in a conductor, especially if the current of interest is carried by a conductor which is physically enclosed or shielded within a conduit, or within a wall or junction panel which can only be safely accessed by trained personnel, possibly only after the power has been interrupted.

Electrical current can be measured either invasively, i.e. by directly connecting a sensor in series with the circuit, or non-invasively by sensing the magnetic and/or electric field generated by current in the immediate vicinity of a conductor. FIG. 1 illustrates a current (or voltage) source 100 transmitting an electrical current via a conductor 102 through a load impedance 104, whereby a magnetic field 106 is generated surrounding the conductor 102. This magnetic field 106 can be detected by any of several types of sensor, including a loop of wire or a "Hall-effect" sensor.

In many applications, including home electrical usage, it is generally desirable to measure current non-invasively so as to avoid the need to make direct contact with conductors carrying dangerous levels of voltage. Current can be non-invasively sensed by surrounding a conductor with a "loop" sensor. This approach is relatively insensitive to the precise location and orientation of the sensing loop, and it is relatively insensitive to noise sources such as fields generated by current flowing outside of the loop. However, loop sensors can be difficult to implement if access to the conductor is restricted. Also, periodic calibration can be required, due to long term drift and degradation of the device, as well as variations in temperature and other environmental conditions.

Current can be non-invasively sensed without surrounding a conductor with a sensor, simply by placing a sensor at a location near the conductor. However, the signal obtained from such a sensor will depend strongly on its exact location and orientation relative to the conductor. Also, the signal obtained from such a sensor will include contributions from magnetic fields generated by other nearby sources, such as current carried by wires which are physically near the conductor of interest. These effects can make the output of a remote, non-loop sensor difficult to interpret with accuracy.

Typically available non-invasive devices for measuring current are based on the surrounding loop approach, and therefore require physical access to the individual conductors which are to be measured. This can require access to the interior of an electrical panel (such as a circuit breaker panel) and/or invasive intrusion into a service conduit or cable, such as a so-called "service entrance" or SE cable, so as to remove the conductors from the conduit or cable, separate the individual conductors apart from each other, and place a loop around each individual conductor or cable.

Access to conductors within a circuit breaker panel typically requires removal of a circuit breaker panel cover, which can be dangerous and may require the services of a trained professional and the involvement of the power utility company, as well as temporary interruption of electrical service to the building so as to satisfy safety requirements and/or local laws. And once sensors have been installed, this process may need to be repeated periodically for temporary removal and calibration of the sensors, leading to repeated service calls by trained professionals and repeated interruptions in electrical service.

Non-loop devices exist for the non-intrusive measurement of current in cables or conduits containing multiple conductors, such as a service entrance (SE) cable. However, these devices typically are configured for use only with a specific type of cable, and must be accurately aligned with the conductors inside of the cable. Even when properly used, these devices tend to provide inaccurate or unreliable measurements.

Another approach to non-invasive measurement of whole-building current usage is to mount an optical sensor or radio receiver directly on an electrical meter provided by the power company. However, this approach is compatible only with certain types of electrical meters, and therefore cannot be used in many circumstances. Also, this approach cannot be used to monitor current usage on individual branches of electrical service within the building.

In a few regions, the local power company offers a "smart meter" which is installed by the power company in place of the standard electrical meter, and which communicates power usage to the power company on a periodic basis, typically hourly. The power company makes this information available to the consumer over the internet or some other network, thereby allowing the consumer to monitor power usage. Similar meters are available in some areas which transmit their readings to monitoring devices within the building. However, these approaches only provide periodic measurements, and are only available in a few areas. In addition, this approach typically cannot be used to monitor current usage on individual branches of electrical service within the building.

What is needed, therefore, is an apparatus which can accurately and non-invasively monitor current usage without requiring access to the interior of a power distribution cable or a junction box, and without requiring installation of the apparatus by an electrician or other technically knowledgeable individual.

SUMMARY OF THE INVENTION

A system for accurate measurement and monitoring of electrical current flowing through a conductor in a power distribution system, or in any electrical circuit, includes a sensor, a receiver, and a calibration signal generator, or "CSG." In some embodiments, the sensor is a non-invasive, non-loop magnetic field sensor. In other embodiments, the sensor is an electrical field sensor, or a sensor that directly detects voltage or current. The CSG can be connected to the electrical circuit, in some embodiments by connection to a standard electrical wall outlet or light socket, and can impose an automatically repeated current fluctuation or "calibration signal" ("CS") onto the circuit by drawing current from and/or adding current to the electrical circuit in known amounts and in a well-defined, time-varying pattern.

In various embodiments, the invention can be used to monitor and balance electrical current usage throughout a power distributions system, for example in a home or commercial building. In some embodiments, the invention can be used to calibrate and/or verify the accuracy of an electrical meter or "smart" meter provided by a power company.

In embodiments, the CSG draws current through a calibrated impedance in a pulsed, sinusoidal, or otherwise time-varying fashion, so as to impose a current fluctuation having an amplitude which is directly proportional to the voltage. In other embodiments, the CSG draws a known amount of current from the electrical circuit in a well characterized, time-varying fashion. In still other embodiments, the CSG adds a known amount of current to the electrical circuit.

In some embodiments, the amplitude of the calibration signal is constant, while in other embodiments the amplitude is variable, with the amplitude being communicated to the receiver by messages encoded within the calibration signal or by separate wired or wireless communication from the CSG to the receiver.

In embodiments the magnetic field sensor is placed near the electrical conductor at a location between a current source and the CSG. In some embodiments the magnetic field sensor includes an EMF concentrator, which provides a stronger signal and a more targeted sensitivity to current.

The receiver analyzes the sensor output signal from the magnetic field sensor, and uses the known time varying pattern of the calibration signal to distinguish a component of the sensor output signal which corresponds to the calibration signal. Since the amplitude of the calibration signal is known, it can be used to calibrate the overall sensor output signal due to the totality of current flowing in the conductor, and thereby to obtain an accurate measurement of the current flowing through the conductor.

Typically, the calibration signal will be relatively small in amplitude compared to the total current flowing in the conductor, so that the variations in the sensor output signal due to the calibration signal can be considered linear. However, the response of the sensor over larger ranges of current may not be linear, for example if an EMF concentrator is included with the sensor. In some of these embodiments, the receiver collects calibration data over a range of different current levels as they naturally occur, and maintains calibration data such as a table or a calibration curve for the entire current range.

Similarly, in some embodiments the response of the sensor over large ranges of calibration signal repetition or modulation frequencies is not constant, and the receiver is able to accumulate and maintain calibration data which enables calibration of the sensor output signal at a plurality of values within the range of repetition or modulation frequencies.

In certain embodiments applicable to building wiring, one or more remote sensors can be placed near a circuit breaker on a user-accessible panel of a circuit breaker cabinet. In some of these embodiments, one or more sensors are pre-installed in a thin sheet or panel which is sized to fit over the user-accessible panel, so as to automatically locate the sensors above circuit breakers or other known conductor locations. In some of these embodiments the thin sheet further includes a plurality of electrical leads for connection of the sensors to one or more receivers. In still other embodiments, the remote sensor(s) can be wrapped around or otherwise placed in proximity to a power cable containing one or more conductors, such as an SE cable delivering power to a building.

In various embodiments, the CSG can be simply plugged into a wall outlet or connected to a light socket in place of a light bulb. In some embodiments the CSG is powered by the circuit to which it is attached, while in other embodiments the CSG is separately powered.

Current flowing in a plurality of circuit branches, for example separate phases in a multi-phase service or branch circuits connected to separate circuit breakers in a building electrical system, can be detected by a plurality of sensors placed, for example, in a circle surrounding an SE cable, or placed over each of a plurality of circuit breakers. In some embodiments, the number of sensors exceeds the number of conductors. This approach allows for sensors to be selected which have the best alignment with the conductors. This approach also allows for a sufficient number of measurements to be made to enable determination and elimination of the effects of any ambient magnetic fields which are unrelated to the conductors being measured, such as nearby power lines.

A plurality of CSG's can be used to separately calibrate the signals from each of the sensors, including calibration of any cross-talk which may occur if the circuit breakers or other conductors are close enough to each other to cause sensors to detect magnetic fields which are generated by adjacent conductors with which they are not directly associated. The CSG's can be configured to generate calibration signals which are easily distinguished from each other due to differences in time variation pattern, phase, polarity differences, synchronicity with an AC waveform, and/or synchronicity with a timing signal provided by the receiver, for example in a DC system such as a solar or wind power system.

In some embodiments where it is not convenient or desirable to connect a separate CSG to each branch of an electrical system, a "total current" sensor is used to calibrate the signals from sensors applied to those branches that do not include CSG's. A CSG attached anywhere within the system is used to calibrate the signals from the total current sensor. Then, when a natural current fluctuation occurs in a branch that does not include a CSG, it is detected simultaneously by the total current sensor and by the sensor associated with the specific branch. The receiver determines the magnitude of the current fluctuation using the calibrated signals from the total current sensor, and then uses the result to calibrate the signal from the sensor applied to the branch that does not include a CSG.

In various embodiments, monitoring of electrical current is occasional or continuous, and calibration is performed only on installation, on demand, occasionally, or continuously. For embodiments which measure AC current, the timing of the CSG calibration signal can be synchronized with the waveform of the AC voltage and/or current, and in some of these embodiments the time-varying calibration signal is repeated every current cycle. In embodiments which measure DC current, a timing signal can be provided by the receiver or by another source, and the CSG calibration signal can be synchronized to the timing signal.

In certain embodiments, the CSG calibration signals are configured as one or more bursts or pulses, each of which lasts only a few milliseconds in some embodiments. And in some of these embodiments, the pulses occur only near maxima, minima, and/or null crossings of an AC voltage or current waveform, so as to avoid overlap and simplify identification of calibration signals from each of a plurality of CSG's, and/or to ensure that the calibration signals can be distinguished from any noise spikes and/or other electrical noise which may be present on the conductor due to electric motors and/or other noisy devices connected to the circuit.

In various embodiments, each calibration signal includes a plurality of pulses having a known timing and a known duty cycle. For example, in some embodiments the calibration signal takes place during a signal period which is divided into equally spaced intervals or "time slots." Pulses occur during some of the time slots but not others, so as to provide a unique and identifiable pulse pattern of "ones" and "zeros." In some of these embodiments, a plurality of CSG's provide calibration signals having different pulse patterns, but all having the same number of time slots and the same number of pulses so that the detection threshold for the pulses can be set according to an integral over the entire pattern. For example, in some embodiments pulses occur in exactly 50% of the time slots for all of the pulse patterns, and the detection threshold is set equal to the average amplitude over the entire set of pulses, which corresponds to 50% of the pulse amplitude.

In similar embodiments, pulses are applied with differing amplitudes, so as to encode the identity of the calibration signal in multi-state logic rather than simply binary logic. In still other embodiments, pulses of differing widths are applied, and the pulse widths are used in distinguishing the calibration signals.

In some embodiments, for example in DC systems where the timing of calibration signals from different CSG's may be difficult to synchronize and overlapping signals must be distinguished, calibration signals are distinguished from one another according to frequency differences in their time-varying patterns, which in some embodiments are digital pulse patterns and in other embodiments are sinusoidal or other analog time variations. In other embodiments, pulsed calibration signals are distinguished from each other according to known, orthogonal pulsing patterns in a manner similar to "Code Division Multiple Access (CDMA) signal discrimination in wireless communications.

In certain embodiments, direct communication is provided between the CSG and the receiver by wired and/or wireless means. In various embodiments, the communication can be unidirectional or bi-directional, and can be used for synchronization of the calibration signal timing, for example in DC current systems such as solar or wind power applications, and for reporting of faults and communication of other messages. In other embodiments, the calibration signals are synchronized with an AC voltage waveform, and the receiver uses the AC waveform to determine the expected timing of the calibration signals. And in some embodiments, the CSG is able to encode messages within the calibration signals which can be detected and interpreted by the receiver, thereby providing a mechanism for the CSG to inform the receiver of fault conditions and/or to send other messages to the receiver as needed.

Embodiments of the invention which are applicable to monitoring of current in power transmission lines include a CSG cooperative with each phase-carrying conductor, and a plurality of remote sensors and receivers located periodically along the transmission lines, typically mounted to electrical towers, and including a sensor proximal to each phase conductor at each monitoring location. In some of these embodiments, the receivers communicate with one or more controllers by wired and/or wireless means, so as to allow detection of current leakage and/or potentially impending failures.

In various embodiments, the remote sensors use Hall-effect or other DC-sensitive devices. In some embodiments the CSG's are coupled to the circuit through direct connection and in other embodiments the coupling is by a non-invasive mechanism such as by a split-core current transformer.

In certain embodiments, the receiver, sensor, and CSG are combined into a single unit which clamps around a conductor. And in various of these embodiments which are applicable to circuits with a plurality of branches, a unit is installed on each branch, and the units communicate their measurements to one or more reporting units which collect, combine, and report the collected information. In some of these embodiments, the communication is by wired or wireless means, while in other embodiments each reporting unit includes a sensor which detects total current usage, and the individual units communicate with the reporting units through messages encoded into their calibration signals.

Various embodiments employ calibration signals with high frequencies which can be more easily isolated from sensitive equipment by electrical filters.

Another general aspect of the present invention is an apparatus for calibrating a current sensing device, whereby a CSG adds a calibration signal to an electrical current, and the measurement output of the sensing device is analyzed so as to distinguish the calibration signal and use its known amplitude to calibrate the current sensing device.

One general aspect of the present invention is s self-calibrating system for measuring a quantity of electrical current flowing through an electrical conductor included in an electrical circuit. The system includes a calibration signal generator ("CSG"), configured for coupling to the electrical circuit, the CSG being able to at least one of draw current from and add current to the electrical conductor so as to impose an automatically repeated, time-varying current fluctuation of known strength and time variation pattern onto the current flowing through the electrical conductor, the time-varying current fluctuation pattern being referred to herein as a "calibration signal."

The system further includes a current sensor which, when placed in sensory communication with the electrical conductor, produces a sensor output signal having a signal strength which is related to the quantity of electrical current flowing through the electrical conductor.

The system also includes a receiver which is able to receive the sensor output signal, distinguish according to the known time variation pattern of the calibration signal a component of the sensor output signal which corresponds to the calibration signal, and calibrate the sensor output signal according to the known strength of the calibration signal so as to determine the quantity of current flowing through the electrical conductor.

In embodiments, the electrical circuit includes an electrical outlet, and the CSG is configured for coupling to the circuit by connection of the CSG to the electrical outlet.

In some embodiments, the CSG is able to communicate bi-directionally with the receiver by at least one of wired and wireless means. In other embodiments, the CSG is able to encode a message into the calibration signal and thereby convey the message to the receiver.

In various embodiments the time-varying current fluctuation pattern of the calibration signal is synchronized to an AC voltage or current cycle of the electrical current flowing through the electrical conductor. In some of these embodiments wherein the calibration signal is synchronized to begin near at least one of a maximum, a minimum, and a null-crossing of the AC cycle. In other of these embodiments the calibration signal has a duration which is less than one half of the AC voltage or current cycle.

In certain embodiments the calibration signal includes a current pulse. And in some of these embodiments the current pulse has a duration of less than 10 msec.

In various embodiments the calibration signal includes a pulse pattern having a total number of time slots in which current pulses can occur and a total number of current pulses which occur in some but not all of time slots, a threshold for detection of the current pulses being set by the receiver according to a ratio of the total number of current pulses divided by the total number of time slots.

In some embodiments at least one of the CSG and the receiver is powered by the electrical circuit.

In embodiments, the sensor is a magnetic field sensor which is able to sense a magnetic field generated by current flowing through a circuit breaker when the sensor is placed near the circuit breaker. In some of these embodiments, the receiver is able to receive the sensor output signal from the magnetic field sensor through a flat, flexible cable which is able to extend through a gap between a closed cover or door of a circuit breaker enclosure containing the circuit breaker.

In various embodiments, a plurality of sensors is affixed to a sheet having dimensions which allow the sheet to be placed proximal to a plurality of conductors, thereby locating the sensors in proximity to the conductors. And in some of these embodiments the conductors are cooperative with a plurality of circuit breakers, sheet can be affixed to a structure which is cooperative with the plurality of circuit breakers.

In certain embodiments a plurality of sheets, each having at least one sensor affixed thereto, can be placed proximal to a plurality of conductors so as to locate each of the plurality of sensors proximal to a respective conductor, intercommunication between the sheets of sensor output signals from the plurality of sensors being provided by at least one of physical contact between the sheets and an interconnecting cable between the sheets, In some embodiments the sensor includes a Hall-effect device. In other embodiments, the sensor includes an electromagnetic field concentrator.

In various embodiments the system comprises a plurality of sensors which can be associated with a plurality of electrical conductors, and the receiver is configured for determining the quantities of current flowing through each of the plurality of electrical conductors. In some of these embodiments the plurality of electrical conductors are contained within an electrical cable or conduit. In other of these embodiments the plurality of electrical conductors is exceeded in number by the plurality of sensors, and the receiver is configured for determining an amplitude of an external magnetic field not produced by any of the plurality of electrical conductors, as well as determining the quantities of current flowing through each of the plurality of electrical conductors. In some of these embodiments the system comprises a plurality of CSG's. In some of these embodiments the plurality of CSG's are able to produce calibration signals which are distinguishable from each another. In some of these embodiments the calibration signals are distinguishable due to differences in at least one of polarity and timing. In other of these embodiments the calibration signals include pulse patterns, and the calibration signals are distinguishable from each other due to differences between their pulse patterns. And in some of these embodiments the pulse patterns of the calibration signals are mutually distinguishable according to differences in pulse widths, pulse timings, pulse repetition rates, pulse amplitude patterns, and/or pulse modulation frequencies.

In various embodiments wherein the system comprises a plurality of sensors which can be associated with a plurality of electrical conductors, and the receiver is configured for determining the quantities of current flowing through each of the plurality of electrical conductors, the receiver is able to determine detection sensitivities of at least one sensor to each of a plurality of electrical conductors which are proximal to the sensor. In some of these embodiments the receiver is able to calibrate a first sensor associated with a first branch circuit of the electrical circuit to which a CSG is not coupled by using a calibration signal imposed on a second branch circuit to calibrate a primary sensor associated with a primary electrical conductor which supplies current to both the first branch circuit and the second branch circuit, determining an amplitude and timing of a current event occurring in the first branch circuit using the primary sensor, according to the timing of the current event, distinguishing a component of an output signal from the first sensor which corresponds to the current event, and using the determined amplitude of the current event to calibrate the output of the first sensor.

In various embodiments, the sensor output signal is not linearly proportional to the current over a range of quantities of electrical current, and the receiver is able to accumulate and maintain calibration data which enables calibration of the sensor output signal at a plurality of values within the range of quantities of electrical current.

In some embodiments, the sensor output signal is not uniform over a range of calibration signal repetition or modulation frequencies, and the receiver is able to accumulate and maintain calibration data which enables calibration of the sensor output signal at a plurality of values within the range of repetition or modulation frequencies.

Other embodiments further include a calibration signal isolator which is able to isolate the calibration signal from a remaining portion of the sensor output signal by subtracting the remaining portion from the sensor output signal, the calibration signal isolator being further able to amplify the isolated calibration signal so that it can be digitized with enhanced dynamic range.

In certain embodiments the receiver is able to store the calibration signal between repetitions. And in some embodiments the receiver is able to average the calibration signal over a plurality of repetitions.

Another general aspect of the present invention is a self-calibrating method for measuring a quantity of electrical current driven by a current source through an electrical conductor included in an electrical circuit. The method includes imposing an automatically repeated, time-varying current fluctuation of known strength and time variation pattern onto the electrical current flowing through the electrical conductor by coupling a calibration signal generator ("CSG") to the electrical circuit, the CSG being able to at least one of draw current from and add current to the electrical conductor, the time-varying current fluctuation pattern being referred to herein as a "calibration signal," placing a current sensor in sensory communication with the electrical conductor, the current sensor producing a sensor output signal having a signal strength which is related to the quantity of electrical current flowing through the electrical conductor, according to the known time variation pattern, distinguishing a component of the sensor output signal that corresponds to the calibration signal, and using the known strength of the calibration signal, calibrating the sensor output signal and determining the quantity of electrical current flowing through the electrical conductor.

Various embodiments further include imposing automatically repeated, time-varying current fluctuations on each of a plurality of electrical conductors, placing at least one of a plurality of current sensors in sensory communication with each of the plurality of electrical conductors, calibrating the response of each of the plurality of sensors to each of the plurality of electrical conductors, and determining amounts of current flowing through each of the plurality of electrical conductors.

Yet another general aspect of the present invention is a system for calibrating an electrical current sensor, the electrical current sensor being able to generate a sensor output signal corresponding to a quantity of electrical current flowing through an electrical conductor included in an electrical circuit. The system includes a calibration signal generator ("CSG"), configured for coupling to the electrical circuit, the CSG being able to at least one of draw current from and add current to the electrical conductor so as to impose an automatically repeated, time-varying current fluctuation of known strength and time variation pattern onto the current flowing through the electrical conductor, the time-varying current fluctuation pattern being referred to herein as a "calibration signal" and a receiver which is able to receive the sensor output signal, distinguish according to the known time variation pattern of the calibration signal a component of the sensor output signal which corresponds to the calibration signal, and calibrate the sensor output signal according to the known strength of the calibration signal.

The features and advantages described herein are not all-inclusive and, in particular, many additional features and advantages will be apparent to one of ordinary skill in the art in view of the drawings, specification, and claims. Moreover, it should be noted that the language used in the specification has been principally selected for readability and instructional purposes, and not to limit the scope of the inventive subject matter.

BRIEF DESCRIPTION OF THE DRAWINGS

FIG. 3 is a diagram of a circuit breaker, showing current flow close to the panel;

FIG. 4C illustrates an embodiment which includes a panel having pre-installed sensors and sized to fit inside the circuit breaker panel of FIG. 4B, so as to locate the sensors above wires connected to the circuit breakers;

FIG. 11B is a functional diagram of an electronic circuit which removes a large "background" current signal from a smaller calibration signal and then amplifies the calibration signal to be detected with maximum dynamic range.

DETAILED DESCRIPTION

Figure 2:
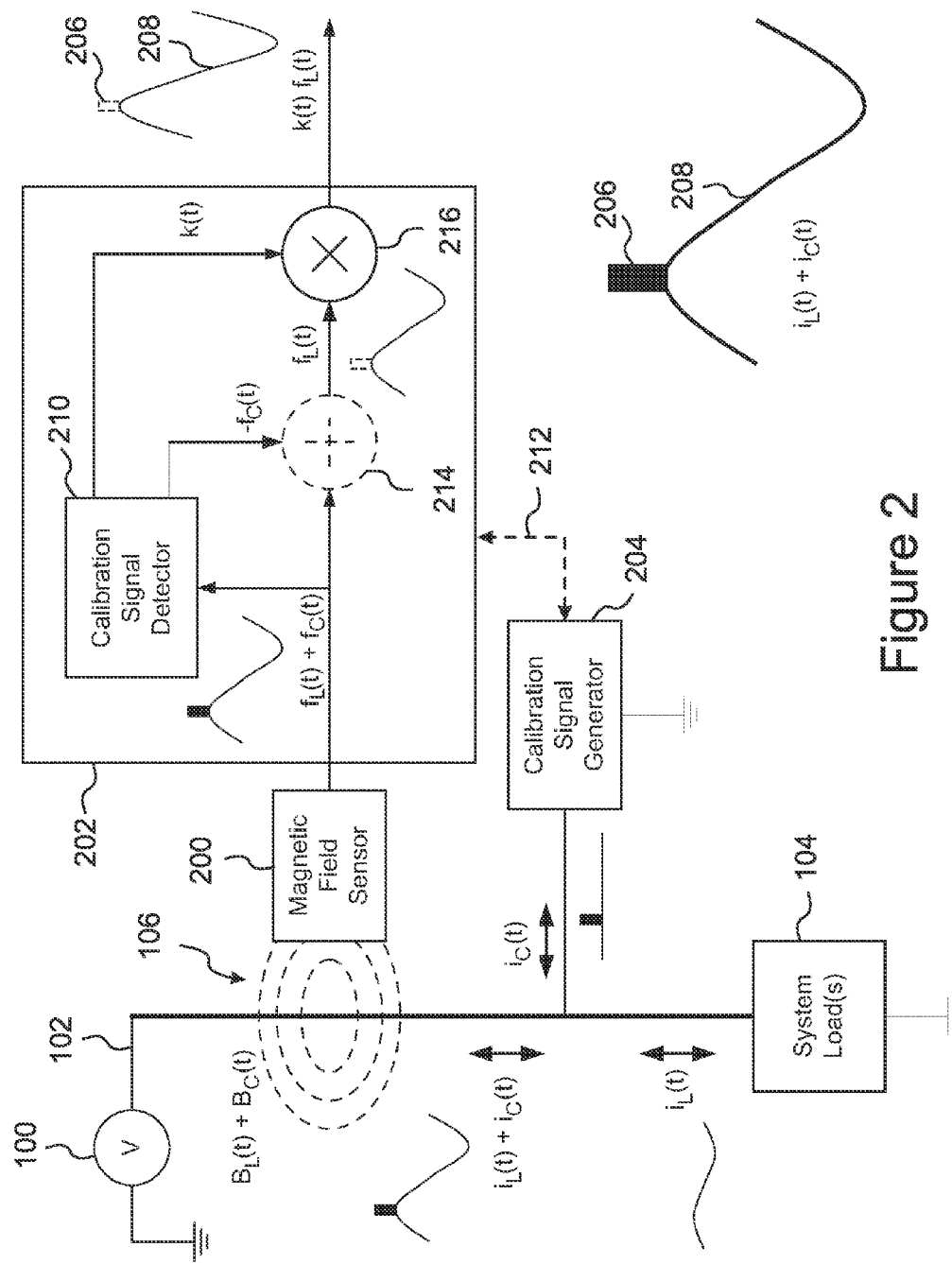
FIG. 2 is a block diagram of an embodiment which includes a single sensor.

The present invention is a system for accurate, non-invasive measurement and monitoring of electrical current flowing through building wiring, or through any electrical circuit or circuits. With reference to FIG. 2, the system includes a remote current sensor 200, a receiver 202, and a calibration signal generator 204, or "CSG."

Figure 1:
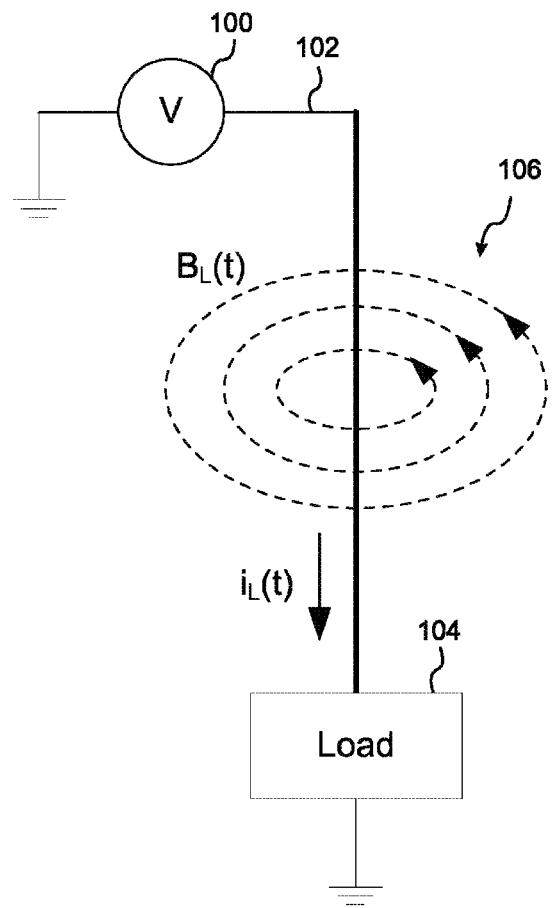
FIG. 1 is a circuit diagram illustrating current flowing from a source through a circuit and into a load, showing a magnetic field generated around a conductor.

In embodiments, the sensor 200 is sensitive to the magnetic field generated by current flowing through a conductor. As discussed above with reference to FIG. 1, it is well known in the art that an electrical current flowing through a conductor 102 generates a proportional magnetic field 106 circulating around and orthogonal to the conductor 102. The direction and intensity of the magnetic field 106 is, respectively, dependent on the direction of current flow and the amount of current.

Devices for non-invasively measuring current in a conductor 102 by measuring the associated magnetic field can be broadly classified into two categories: "loop" sensors that form a closed loop around the conductor, and non-loop sensors that do not. Loop sensors are, by design, relatively insensitive to their positioning and orientation, and they are relatively insensitive to magnetic fields generated by conductors and other sources which lie outside of the loop. Non-loop sensors, on the other hand, are highly sensitive to their positioning and distance from the conductor, and they will detect magnetic fields generated by nearby conductors and/or other sources. Typical examples of non-loop sensors include wire "pick-up" coils and Hall-effect sensors. The present invention is applicable to both loop and non-loop sensors.

In FIG. 2, the non-loop "remote" sensor 200 is illustrated as being located within a magnetic field 106 generated by a conductor 102. The strength of the sensor output signal that the sensor generates will be due to many factors, of which the main factors are the distance of the sensor from the conductor 102, as well as the orientation of the sensitive axis of the sensor 200, if applicable, to the magnetic field direction at the location of the sensor. Use of an EMF concentrator will further affect the strength of the sensor output signal.

Since the intensity of the magnetic field 106 decreases as a function of increasing distance from the conductor 102, movement of the sensor 200 over time and/or movement of the conductor 102 with respect to the sensor 200 can lead to a substantial variation in the amount of magnetic field 106 sensed by the sensor and, consequently, variations in the sensor output signal. The same is generally true for changes in orientation of the sensor 200 and/or the conductor 102 if the sensor 200 has a sensitive axis, which is generally the case. In addition, all sensors 200 exhibit some degree of detection signal variation due to temperature variations, aging, and other effects.

Also, if the sensor output signal is not linearly proportional to the current amplitude 208, due to EMF concentrators, skin effects, proximity effects, or other reasons, it may be necessary to calibrate the sensor 200 over a range of current values. Similarly, it may be necessary to calibrate the sensor 200 over a range of calibration signal pulse repetition rates or modulation frequencies. In the present invention, the CSG 204 is used to calibrate the sensor output signal(s) and to compensate for all of these effects. In embodiments, the calibration is nearly continuous, with calibration measurements being made in some embodiments at least once during each cycle of the AC current.

The CSG 204 in FIG. 2 is configured for connection to a conductor 102 of the electrical circuit, so as to automatically and repeatedly add a calibrating current fluctuation or "calibration signal" ("CS") 206 to the current 208 flowing in the circuit by drawing current from the electrical circuit and/or adding current to the electrical circuit in known amounts and in a well defined, time-varying pattern. In FIG. 2, the calibration signal 206 is illustrated as a single current pulse lasting about 1 millisecond and timed to appear at the maximum of the AC voltage waveform.

In various embodiments, the CSG 204 draws current through a calibrated impedance in a pulsed, sinusoidal, or otherwise time-varying fashion, so as to impose a current fluctuation having an amplitude which is directly proportional to the voltage of the electrical circuit. In other embodiments, the CSG 204 draws a calibrated amount of current from the electrical circuit in a well characterized, time-varying fashion. In still other embodiments, the CSG 204 adds a calibrated amount of current to the electrical circuit. In some embodiments, the calibration signal is a complex signal having a component or harmonic of known amplitude.

In the embodiment of FIG. 2, the CSG 204 generates the calibration signal 206 by drawing current from the electrical circuit, and the remote current sensor 200 is installed near a conductor 102 at a location between a current source 100 and the CSG 204, so as to remotely detect the primary current 208 and/or the calibration signal 206 flowing through the conductor 102. In some embodiments the sensor 200 includes an EMF concentrator, which provides a stronger signal and a more targeted sensitivity to current.

In various embodiments, the sensor 200 is a non-loop sensor 200, in that it does not need to surround the conductor of interest. The receiver 202 analyzes the output signals from the sensor 200, and uses the known time varying pattern of the calibration signal 206 to distinguish the calibration signal 206 from the remainder of the overall current flow in the conductor 208. The receiver then uses the known amplitude of the calibration signal 206 to calibrate the sensor output, and thereby to convert the detected signal 208 into an accurate measurement of current 208 flowing through the conductor.

In the embodiment of FIG. 2, the receiver 202 includes a calibration signal detector 210 which measures, distinguishes, and extracts the calibration signal 206 component from the composite output signal received from the sensor 200. In some embodiments, communication 212 is provided between the CSG 204 and the receiver 202, whereby the CSG provides calibration signal timing and synchronizing information to the receiver (or vice-versa), thereby assisting the calibration signal detector 210 to locate and distinguish the calibration signal 206. In other embodiments, there is no direct communication from the CSG 204 to the receiver 202, and instead the calibration signal detector 210 uses the known timing of the calibration signal 206, for example it's timing relative to the AC current or voltage waveform, to locate the calibration signal 206. In the embodiment of FIG. 2, the calibration signal detector 210 knows that the calibration signal 206 will appear at the top of the AC current waveform, and therefore knows exactly where to look for the calibration signal 206.

In still other embodiments, the start of the calibration signal 206 is not synchronized with any timing reference which is available to the receiver. Instead, the receiver locates and identifies the calibration signal 206 by searching the sensor output signal for known characteristics of the calibration signal 206, such as a unique sequence of pulses with a specific "bit pattern" and/or repetition frequency or timing signature. In still other embodiments, the calibration signal 206 is sinusoidal, and can be detected and distinguished from the main current flow 208 and from other calibration signals according to the sinusoidal frequency of the calibration signal 206.

In some embodiments, the receiver 202 subtracts 214 the calibration signal 206 from the composite output signal received from the sensor 200. In other embodiments, the calibration signal 206 is of interest as part of the total current usage, or does not significantly affect the current measurement, and is not subtracted. The receiver 202 then compares the detected amplitude of the calibration signal 206 with its known amplitude (e.g. in milliamps), and derives from the ratio a calibration factor k by which the sensor signal is multiplied 216 so as to obtain an accurate measurement of the detected current 208.

Typically, the calibration signal 206 will be a relatively small component of the overall current flow in the conductor 102, so that the variations in the signal from the sensor 200 due to the calibration signal can be considered linear. However, the response of the sensor 200 over larger ranges of current may not be linear, for example if an EMF concentrator is included with the sensor 200. In some of these embodiments, the receiver 202 collects calibration data for a wide range of different current levels as they naturally occur, and/or over a range of CSG calibration signal amplitudes, and stores the calibration data, for example in a table or as calibration curve, so that the calibration data can be used to convert the sensor output signals to current measurements over the entire current range.

Similarly, in some embodiments the response of the sensor 200 over large ranges of calibration signal pulse repetition or modulation frequencies is not constant, and the receiver 202 is able to accumulate and maintain calibration data which enables calibration of the sensor output signal 208 at a plurality of values within the range of repetition or modulation frequencies.

Some embodiments which are applicable to measurement of electrical current supplied to a building include sensors 200 which can be installed so as to sense current running through one or more circuit breakers. FIG. 3 is a cross-sectional side view of a typical residential or industrial circuit breaker 302 attached to a panel 300. Since circuit breakers 302 generally have current conducting elements very near the front of the unit, a substantial portion of the magnetic field from the current flowing through a circuit breaker 302 is available for sensing near the front surface of circuit breaker 302, and near the accessible front surface of the panel 300.

Figure 4A:
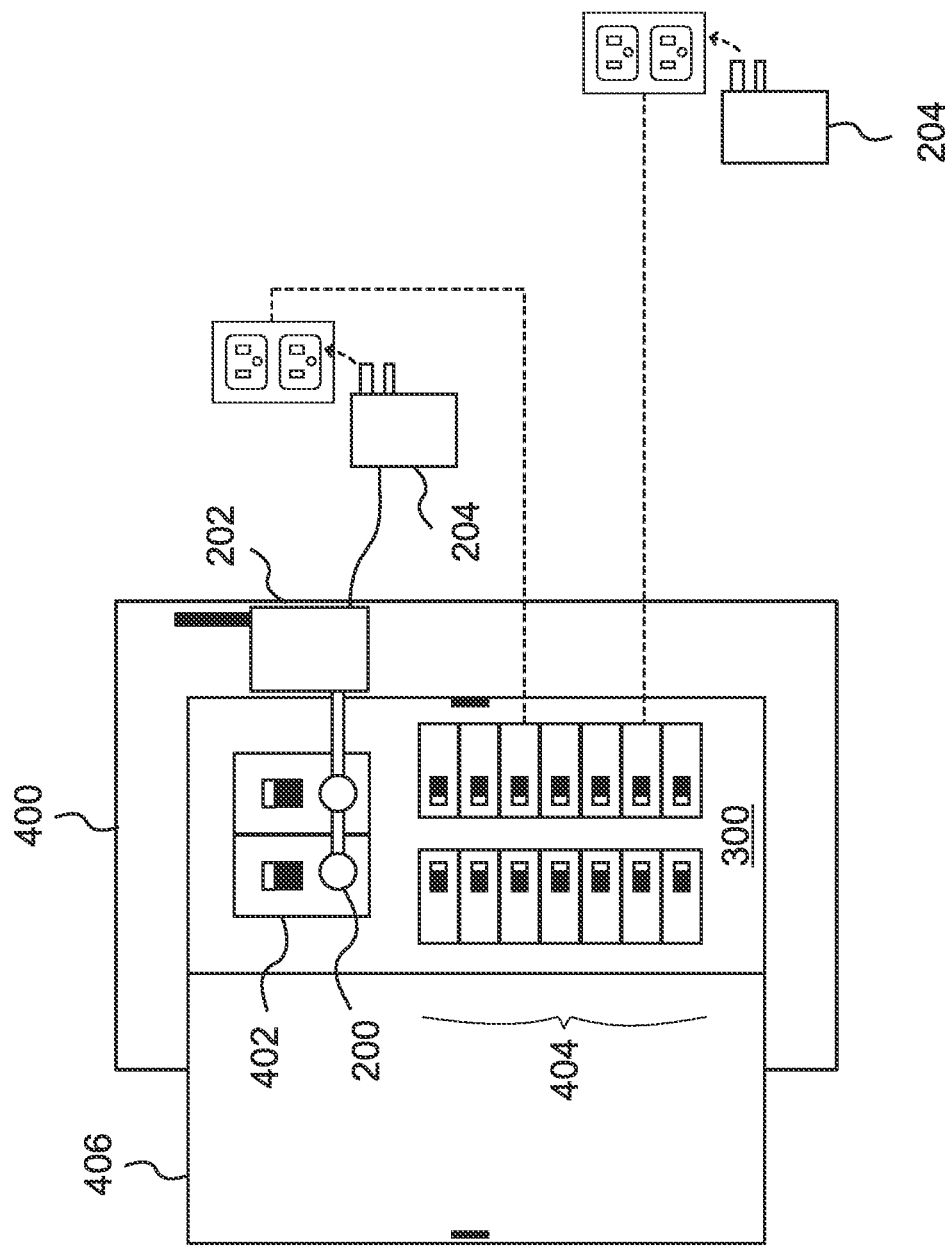
FIG. 4A illustrates an embodiment of the invention having sensors placed immediately above circuit breakers in a typical residential panel.
Figure 4B:
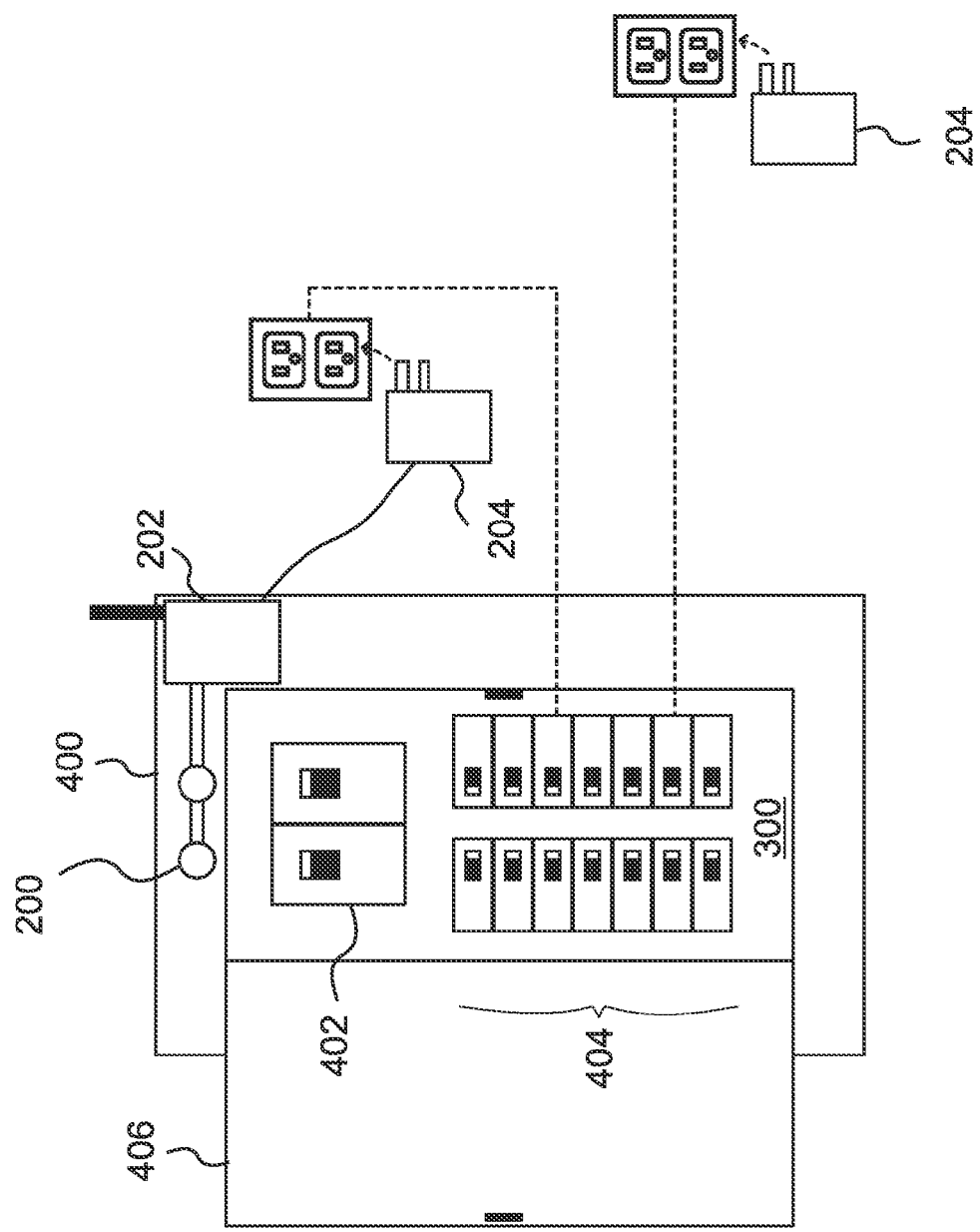
FIG. 4B illustrates an embodiment of the invention having sensors placed directly above the door to a circuit breaker panel, and above the main conductors bringing electrical service to the panel.

Thus, as illustrated in FIG. 4A, remote sensors 200 can be placed on user-accessible locations of the breaker panel 300 directly above the main circuit breakers 402. In some embodiments, sensors are also placed above the branch circuit feeder breakers 404, so as to measure the associated current in each branch circuit. Given the permeability of steel at the frequencies of interest (typically 50 Hz or 60 Hz), in cases where it is not convenient to mount the sensors 200 directly on the breaker panel 300, the sensors can be mounted either above the panel 300 or on the outside of the outer door 406 of the circuit breaker cabinet 400, as illustrated in FIG. 4B. In some of these embodiments where the sensors are located within a circuit breaker box or behind a circuit breaker panel cover or door, sensor output signals are conveyed from the sensors 200 to a location outside of the circuit breaker enclosure by a flat, flexible cable which is able to pass through a gap between panels or between the door and a panel.

Note that in FIGS. 4A and 4B, the CSG's 204 are located within power supplies which plug into wall receptacles. The CSG's are powered by the current from the wall receptacles, and one of the CSG's 204 also provides power to the receiver 202.

With reference to FIG. 4C, in some embodiments, the sensors 200 are attached to a panel, plate, or sheet 406 in an arrangement which facilitates placement of all of the sensors 200 simultaneously over a plurality of corresponding conductors 412. In the embodiment of FIG. 4C, the plate 406 is made of a rigid insulating material, such as plastic, and is configured for quick and convenient installation within the interior 420 of a circuit breaker box behind the circuit breaker panel 300. The plate 406 includes a rectangular opening 414 which is just large enough to surround the circuit breakers 402, 404, while covering the wire leads 412 which connect electricity to and from the circuit breakers 402, 404. The sensors 200 are thereby located immediately above the electrical leads 412. In this embodiment, the insulating plate 406 also serves as an added protection against shorting of any of the wire leads 412 against the circuit breaker panel 300. The plate 406 can be installed by a user, and/or it can be incorporated into the circuit breaker box or attached to the circuit breaker panel cover 300 by the manufacturer.

In the embodiment of FIG. 4C, a combined CSG and receiver unit 422 is also attached to the plate 406, and powered by leads 418 which can be connected to electrical wires within the circuit breaker box. The receiver in the unit 422 communicates by wired or wireless means to a display or network device (not shown) so as to provide measurement information to the user. In some of these embodiments, wired communication is provided by a flat, flexible cable having conductors imprinted on a flat, flexible insulating substrate. In similar embodiments, the plate 406 can be mounted on the outer surface of the circuit breaker cover panel 300, so as to place the sensors 200 over the circuit breakers themselves 402, 404 or over the wire leads 412 located on the other side of the panel 300. In some embodiments, the plate 406 is flexible, and/or includes an attachment mechanism such as an adhesive or a magnetic or hook-and-loop strip for attachment to the front or back of the circuit breaker panel cover 300.

In still other embodiments, a plurality of sensors 200 are affixed to a plurality of sheets or strips which can be separately placed so as to locate the sensors 200 proximal to a plurality of circuit breakers 402, 404 or other conductors 412. Intercommunication of sensor output signals is provided between the sheets or strips through physical contact between the strips and/or through interconnecting cables, thereby simplifying communication of the sensor output signals to the receiver, for example by means of a single cable connected to one of the strips. In some of these embodiments, the sensor output signals are communicated between the sheets by serial communication through an interconnecting bus.

Figure 4D:
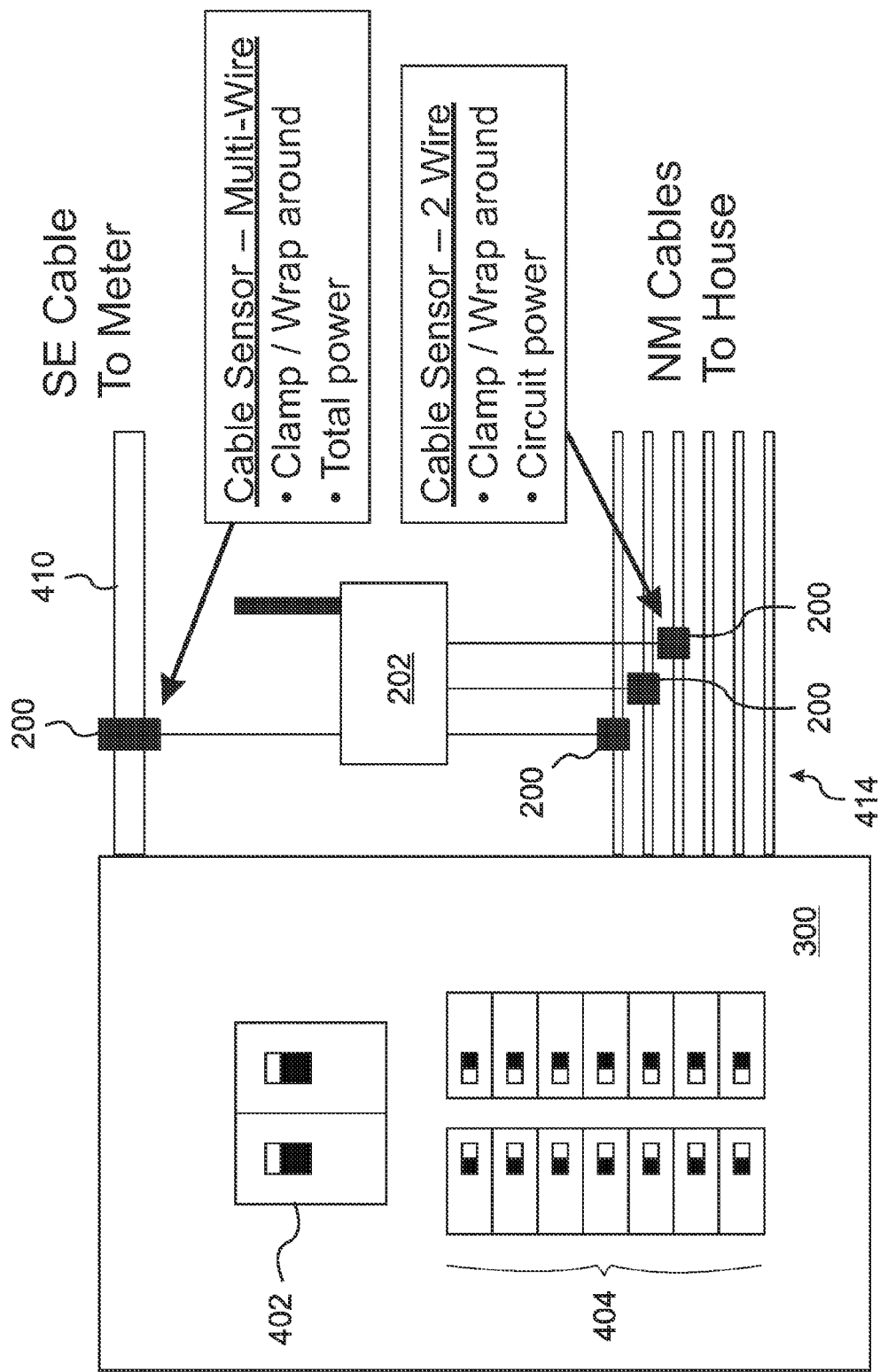
FIG. 4D illustrates an embodiment in which sensors are located near a service cable, and additional sensors are located near branch circuit cables which distribute power throughout a house or other structure.

With reference to FIG. 4D, in various embodiments sensors 200 are clamped, wrapped around, or otherwise placed in proximity to a service cable 410 and/or other branch circuit or other electrical cables or conduits 414, rather than circuit breakers 402, 404 or wire leads 412. In some of these embodiments, the sensors 200 can be placed in a pattern which ensures that a sensor is located near and associated with each conductor in a cable 410, 414. In other embodiments, the sensors 200 are placed without being aligned with the conductors 412 in the cable 410, 414, and the calibration process is used to determine the contribution of each conductor 412 to each sensor 200.

Figure 5:
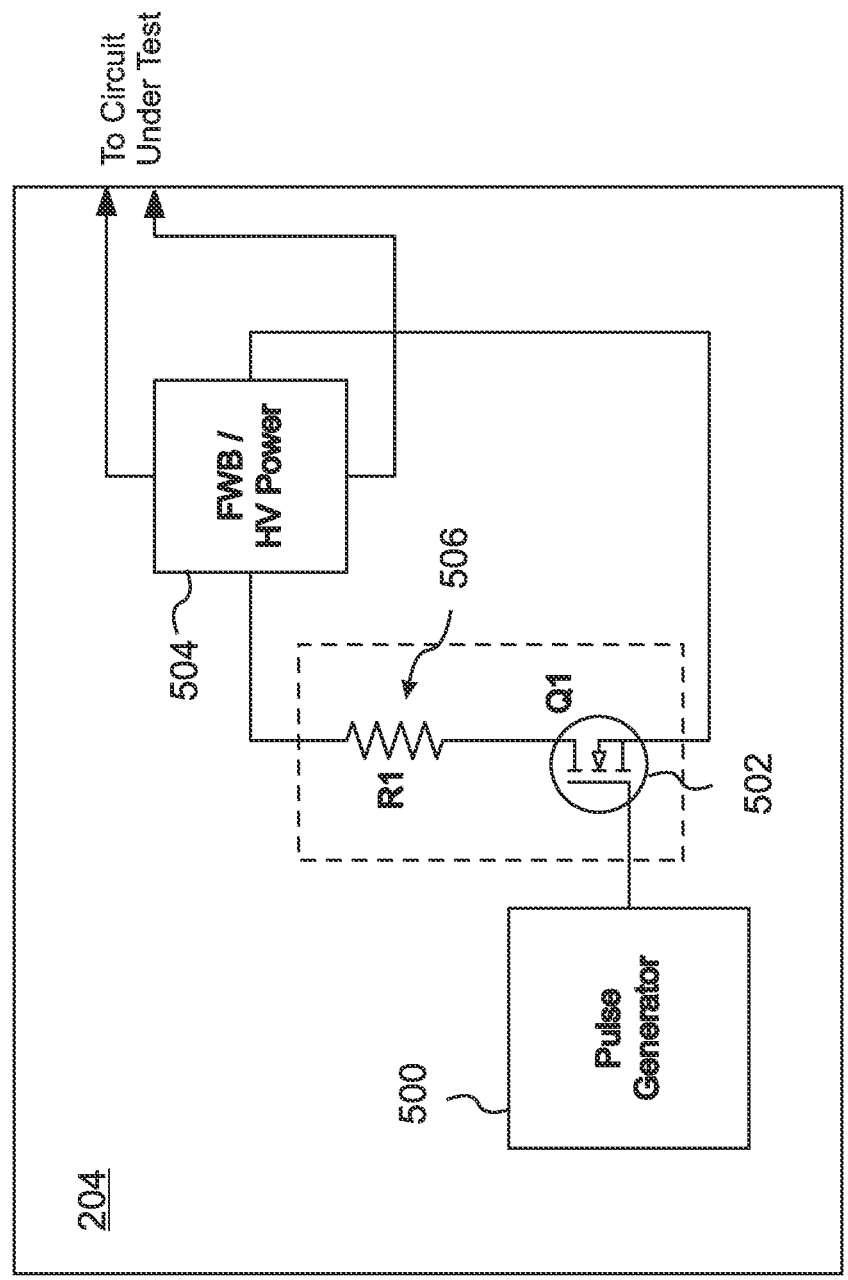
FIG. 5 is a simplified circuit diagram of a CSG in an embodiment.

FIG. 5 is a simplified circuit diagram for a CSG 204 included in an embodiment of the present invention. A timing control unit, which in FIG. 5 is a pulse generator 500, controls a MOS-FET device 502 and a full-wave bridge 504 which interrupts and controls the current flowing through a calibrated current load 506.

Figure 6:
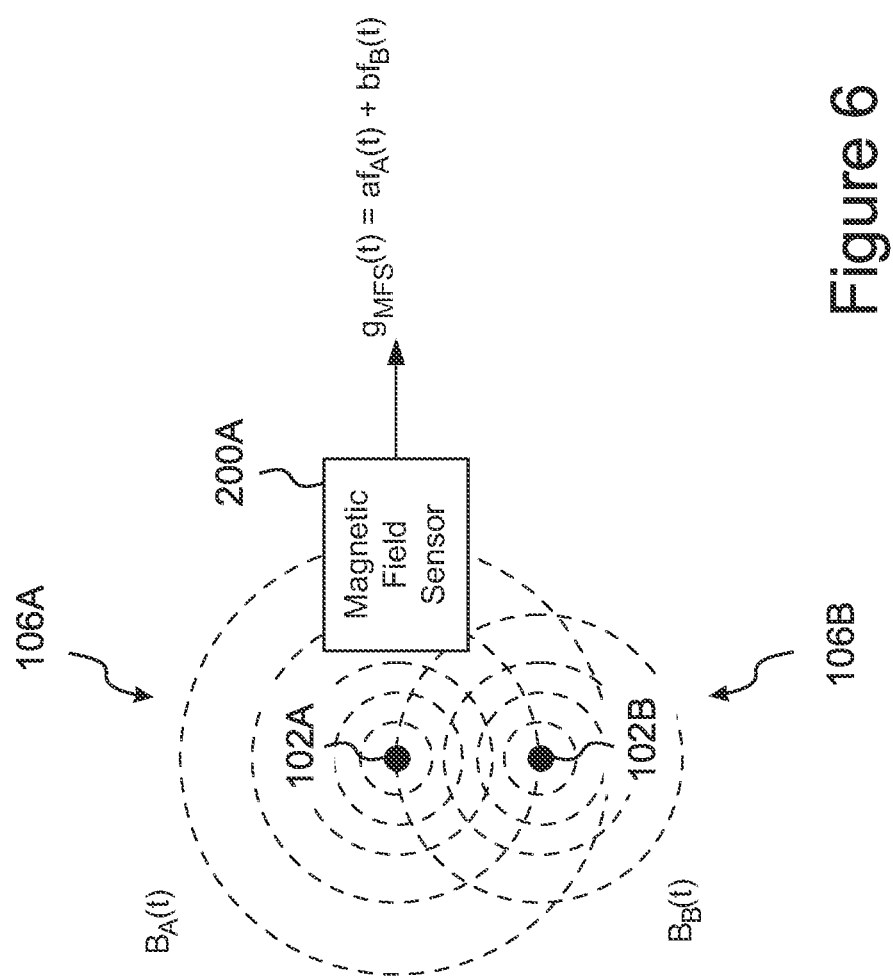
FIG. 6 illustrates detection by a sensor of fields generated by two proximal conductors.

FIG. 6 illustrates a sensing device 200A installed within a magnetic field 106A generated by a first conductor 102A. A second conductor 102B is located near to the first conductor 102A, such that a portion of the magnetic field 106B generated by the second conductor also reaches the sensing device 200A. This can happen, for example, if two sensors 200 are placed above adjacent circuit breakers 402, as illustrated in FIGS. 4A and 4B, or when two sensors 200 are wrapped around a conduit 410 containing parallel, adjacent conductors, as illustrated in FIG. 4D. As a result, the signal generated by the sensor 200A will include a component which is proportional to the current flowing in the first conductor 102A, and a smaller component (because it is further away) due to the current which is flowing in the second conductor 102B.

Figure 7:
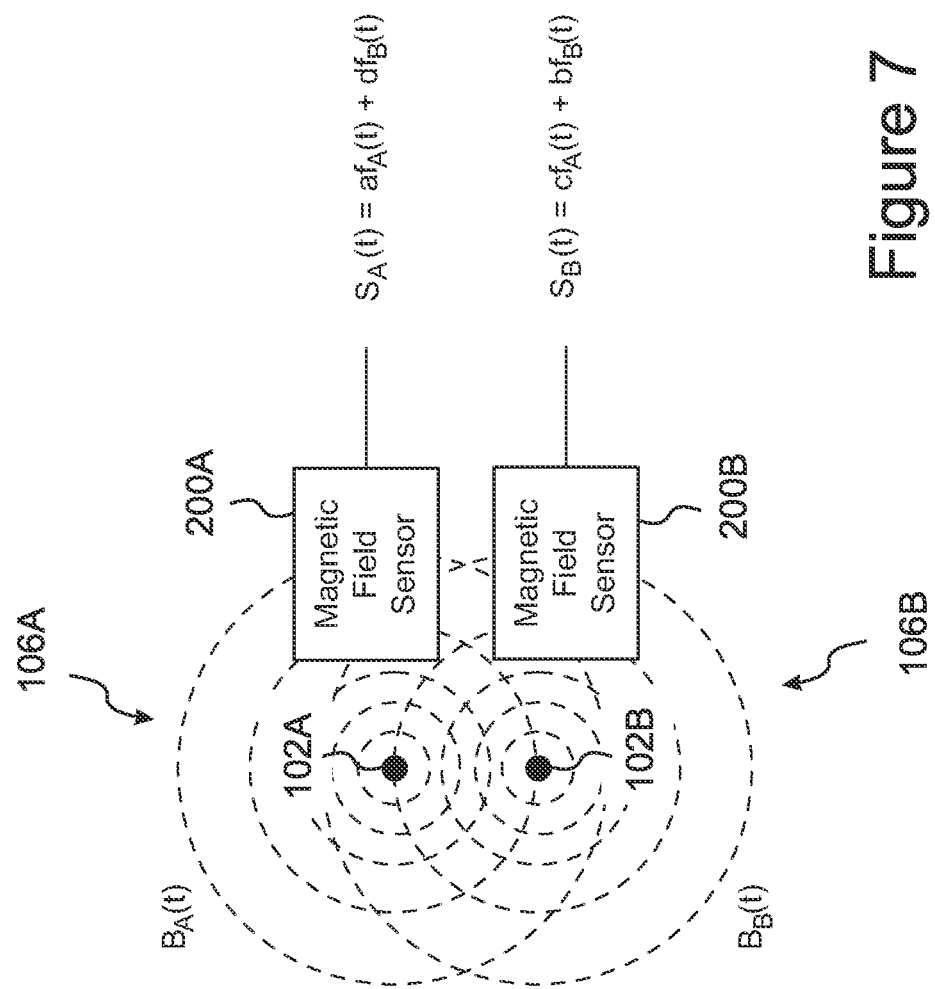
FIG. 7 illustrates a pair of sensors, each detecting the field generated by each of a pair of proximal conductors.

In embodiments of the present invention, when the sensors 200A, 200B detect components from more than one conductor, the separate currents flowing in the separate conductors 102A, 102B are determined by analyzing the sensor output signals from both of the sensors 200A, 200B when calibration signals or other known current components are applied to each of the two conductors 102A, 102B. Each of the two sensors 200A, 200B shown in FIG. 7 will produce an output signal which is a composite of contributions from each of the two conductors 102A, 102B. In general, the output signals from the two sensors 200A and 200B can be written as $$S_A(t) = af_A(t) + df_B(t) \tag{1}$$

and $$S_B(t) = cf_A(t) + bf_B(t) \tag{2}$$

where $f_A(t)$ and $f_B(t)$ are the sensor output signals which would be obtained from the sensors 200A, 200B if each of the sensors 200A, 200B detected only the field from one of the conductor 102A, 102B.

According to equations (1) and (2) above, the individual current signals $f_A(t)$ and $f_B(t)$ can easily be determined if the four coefficients a, b, c, and d, are known. They are given by:

$$f_A(t) = +/- \frac{bS_A(t) - dS_B(t)}{ab - cd} \tag{3}$$

$$f_B(t) = +/- \frac{aS_B(t) - cS_A(t)}{ab - cd} \tag{4}$$

These equations can be used to determine $f_A(t)$ and $f_B(t)$ except where ab is close in value to cd. This will only happen if the two conductors 102A, 102B are close to each other in comparison to their distances from the two sensors 200A, 200B.

Figure 8:
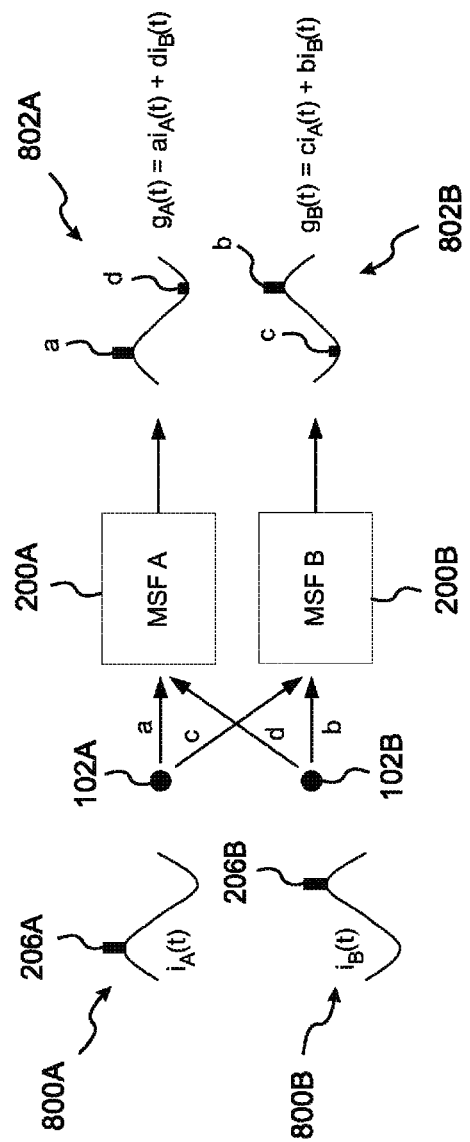
FIG. 8 illustrates detection by the sensors of FIG. 7 of two calibration signals, one imposed on each of the two conductors, and deriving therefrom of coefficients which enable the currents in each of the conductors to be determined.

With reference to FIG. 8, in embodiments of the present invention the values of the coefficients are determined by superimposing separate calibration signals 206A, 206B on the two conductors 102A, 102B. In FIG. 8, the two calibration signals 206A, 206B are synchronized to the AC waveform of the voltage, with the timing of the second calibration signal 206B being offset from the timing of the first calibration signal 206A by one half of the AC cycle, so that the two calibration signals 206A, 206B can easily be distinguished from each other.

In some embodiments, for example in DC systems where the timing of calibration signals from different CSG's 204 may be difficult to synchronize and overlapping signals must be distinguished, calibration signals 206 are distinguished from one another according to frequency differences in their time-varying patterns, which in some embodiments are digital pulse patterns and in other embodiments are sinusoidal or other analog time variations. In other embodiments, pulsed calibration signals 206 are distinguished from each other according to known, orthogonal pulsing patterns in a manner similar to CDMA signal discrimination in wireless communications. In still other embodiments, the calibration signals 208 can be distinguished according to a pulse repetition frequency, or the signals include one or more pulses having a sinusoidal modulation, and they can be distinguished according to the frequencies of the modulations.

Because of the overlap of the magnetic fields 106A, 106B in FIG. 8, each of the sensors 200A, 200B produces an output 802A, 802B which includes components from both of the calibration signals 206A, 206B. Since the calibration signals can be distinguished from each other and are of known amplitude, this provides the four coefficients a, b, c, and d.

Figure 9:
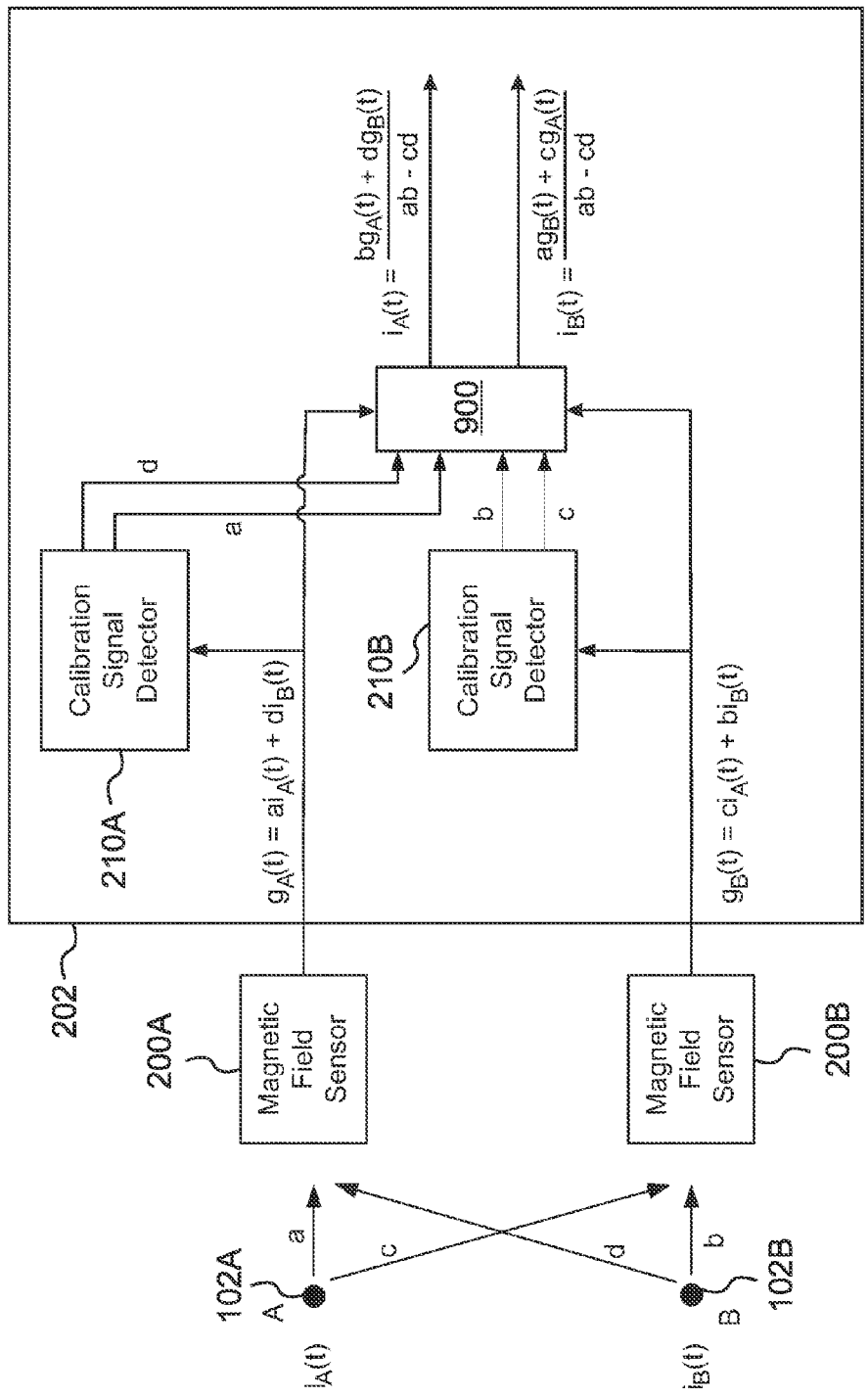
FIG. 9 illustrates application of the coefficients of FIG. 8 by the receiver so as to determine the current in each of the conductors.

With reference to FIG. 9, the receiver in this embodiment includes two calibration signal detectors 210A, 210B, which are used to distinguish the two calibration signals 206A, 206B, and the four coefficients a, b, c, and d. A calculating unit 900 is included which applies the coefficients to the signals 802A, 802B according to equations (3) and (4) above, so as to determine the currents flowing in the two conductors 102A, 102B.

Figure 10:
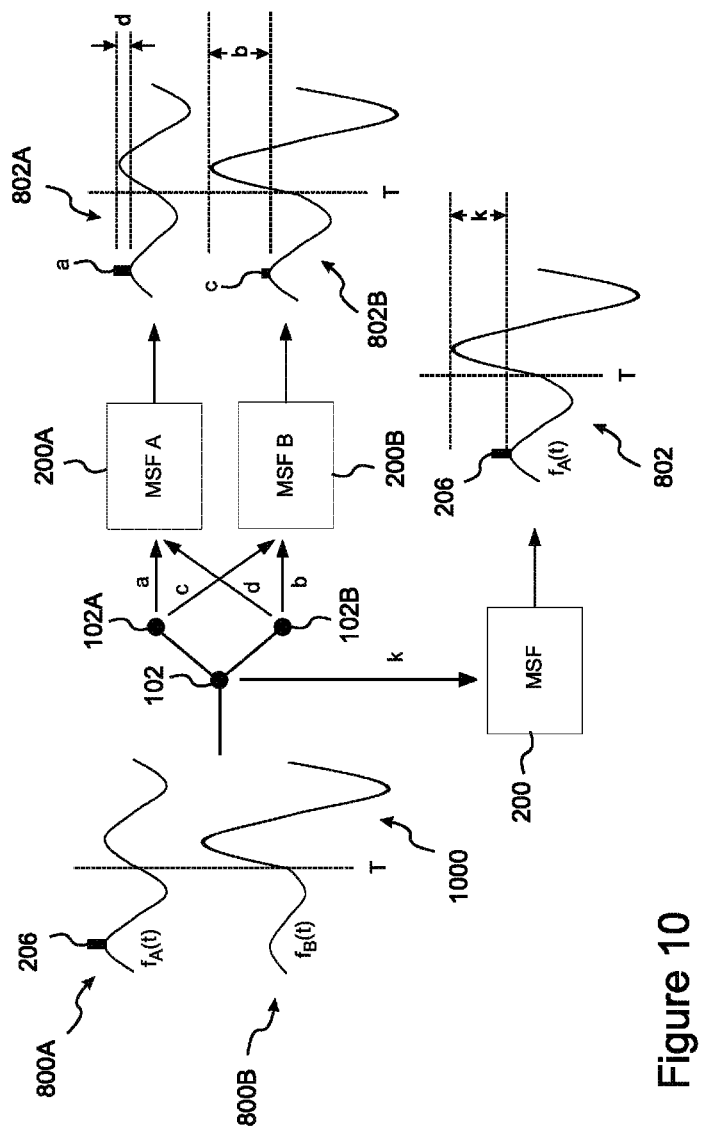
FIG. 10 illustrates use of a total current sensor to calibrate a current event, and then use the calibrated current event as a secondary standard for a circuit which is not accessible to a CSG.

FIG. 10 illustrates how embodiments of the present invention calibrate a sensor associated with a conductor for a circuit which is not associated with a CSG 204. This may be, for example, because the circuit is not accessible to a CSG 204, or it may be because only a limited number of CSG's 204 are available due to cost considerations. In these embodiments, a sensor 200 is associated with a main conductor 102 such as at main circuit breaker through which a total current passes before being divided among a plurality of separate sub-circuits. Two sub circuits 102A and 102B are illustrated in FIG. 10, each of which is associated with a sensor 200A, 200B. A CSG 204 is used to generate a calibration signal 206 on a circuit 102A which is accessible to the CSG 204. The calibration signal 206 is detected by all three sensors 200, 200A, 200B. Coefficients a and c are directly determined from the calibration signal 206 as discussed above. In addition, a calibration constant k is determined for the total current sensor 200.

Subsequently, at some time T a current-changing event 1000 naturally occurs on the CSG-inaccessible circuit. For example, an electric stove or dryer turns on, or a light is turned on or off. The event 1000 is detected by all three sensors 200, 200A, 200B, and the total current sensor 200, the output signal of which has already been calibrated, is used to determine the amplitude of the event 1000.

The relative amplitudes of the event as detected by the two branch circuit sensors 200A, 200B are compared to determine on which branch the event occurred. In FIG. 10, the event clearly occurred on branch B. At this point, the current event can be used as a de-facto calibration signal. The amplitudes of the signal changes from the two branch circuit sensors 200A, 200B can be compared with the known amplitude of the event 1000 as measured by the total current sensor 200, so as to determine the parameters b and d, and all four parameters a, b, c, and d are then available for determining the currents in the separate branch circuits 102A, 102B.

It will be clear to one of ordinary skill in the art that the above processes can be expanded to an arbitrary number of conductors and sensors. Under circumstances where the sensors are non-loop sensors and an external magnetic field is present, for example due to electrical circuits not under test and/or due to other sources, at least one additional sensor can be included in the system, so as to provide sufficient measurements to solve for the currents in all of the circuits under test as well as for the effect of the external magnetic field.

For example, in simpler cases where there is insignificant cross-talk between the branch-circuit sensors 200A, 200B, i.e. c=0 and d=0, a single CSG 204 connected anywhere in the system can be used to calibrate the main circuit sensor 200, i.e. determine k, after which any number of sensors 200A, 200B associated with individual branch circuits can be calibrated by detecting events occurring naturally on those circuits and using the calibrated main circuit sensor 200 to calibrate the branch circuit sensors 200A, 200B.

And in similar circumstances where crosstalk does exist, but where it is small compared to directly detected events (i.e. a>>d and c>>b), relative detection strengths of a plurality of naturally occurring events can be recorded, and used to determine both direct detection (a and c) and indirect detection (b and d) constants for an arbitrary number of branch circuit sensors.

Figure 11A:
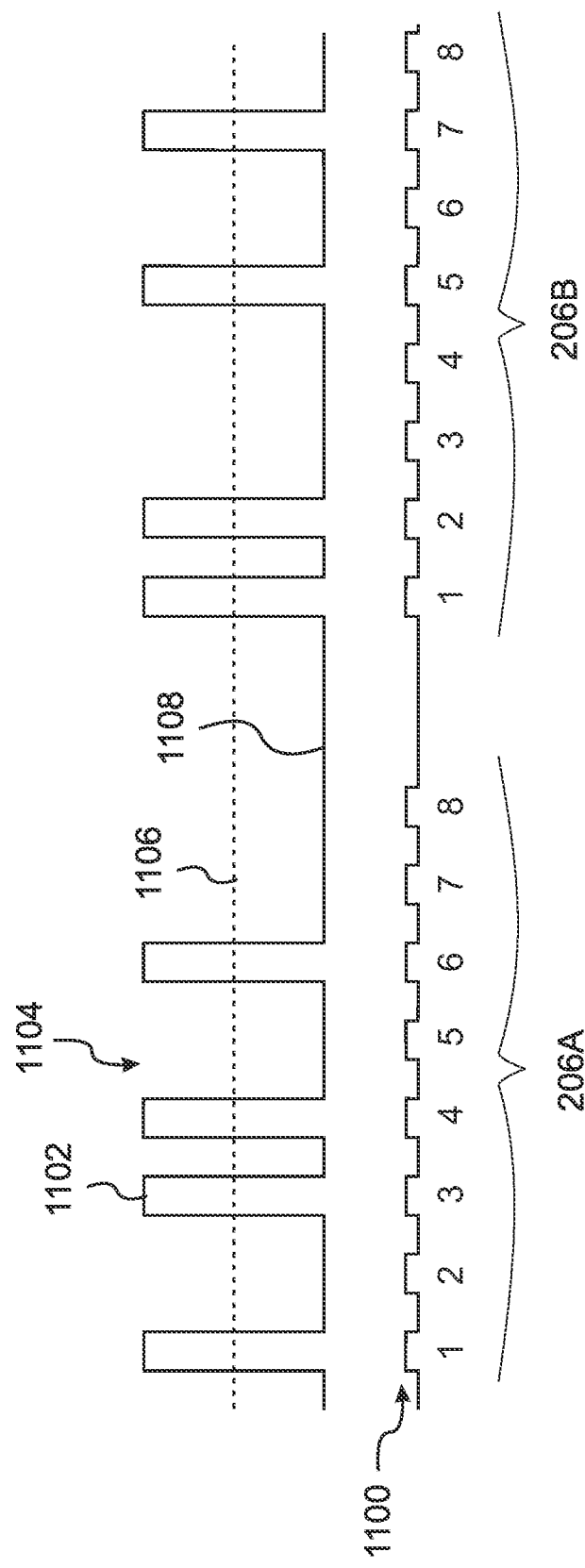
FIG. 11A illustrates a CSG pulse pattern in an embodiment where an average over all the pulses and a known on/off ratio of the pulses is used to set a detection threshold for the pulses.

FIG. 11A illustrates two calibration signals 206A, 206B in an embodiment where the sensor output signals each include a series of calibration pulses. In the embodiment of FIG. 11A, each entire calibration signal 206A, 206B is divided into eight time slots 1100 during each of which a calibration pulse can be generated but is not necessarily generated. By only generating calibration pulses in some of the time slots, each of the calibration signals 206A, 206B includes a unique identifying "code" of digital ones and zeros, which can be used to distinguish the calibration signals 206A, 206B from each other. For simplicity of illustration the two calibration signals 206A, 206B in FIG. 11 are shown as occurring at separated times. However, in practice they may overlap in their timing. They may include synchronization with an AC voltage wave or with another synchronizing signal, or they may be unsynchronized.

Furthermore, in the embodiment of FIG. 11A, all of the calibration signals 206A, 206B generated by the CSG's 204 include pulse patterns 206A, 206B having the same number of "ones" 1102 and "zeros" 1104. Specifically, in the embodiment of FIG. 11 there are an equal number of ones 1102, and zeros 1104 in each of the calibration signals 206A, 206B, even though the pulses 1102 occur in different patterns. The receiver 202 can make use of this known "duty ratio" to set an optimal threshold 1102 for detection of the calibration pulses. In the example of FIG. 11, the "duty ratio" is 50%, and the receiver 202 simply sums the signals during all of the time slots 1100, and divides by the number of time slots to provide a threshold 1106 which is half-way between the top of the background current signal 1108 and the tops of the calibration pulses 1102.

In similar embodiments, the calibration signal 206 includes pulses with differing amplitudes, and the identity of the calibration signal 206 is encoded using multi-state logic rather than binary logic. In still other embodiments, the calibration signal 206 includes pulses of differing widths, and the pulse widths are used in distinguishing the calibration signals 206.

FIG. 11B is a functional diagram of an electronic circuit which is included in some embodiments to remove a large "background" current signal 208 from a smaller calibration signal 206 and then amplify the calibration signal 206 to be detected with maximum dynamic range. A processor 1110 determines the amplitude, and in some embodiments also the shape, of the background current signal 208. For example, if the background current 208 is substantially constant during the calibration signal 206, the processor 1110 simply samples the current just before the calibration signal 206 begins. The processor 1110 then uses a DAC 1112 to supply an input into a differential, unity amplifier 1114 which subtracts the background signal 208 from the calibration signal 206. The processor 1110 then controls the gain of a variable gain amplifier 1116 to amplify the calibration signal 206 so that it can be detected by an ADC 1118 at maximum or near-maximum dynamic range.

Figure 12:
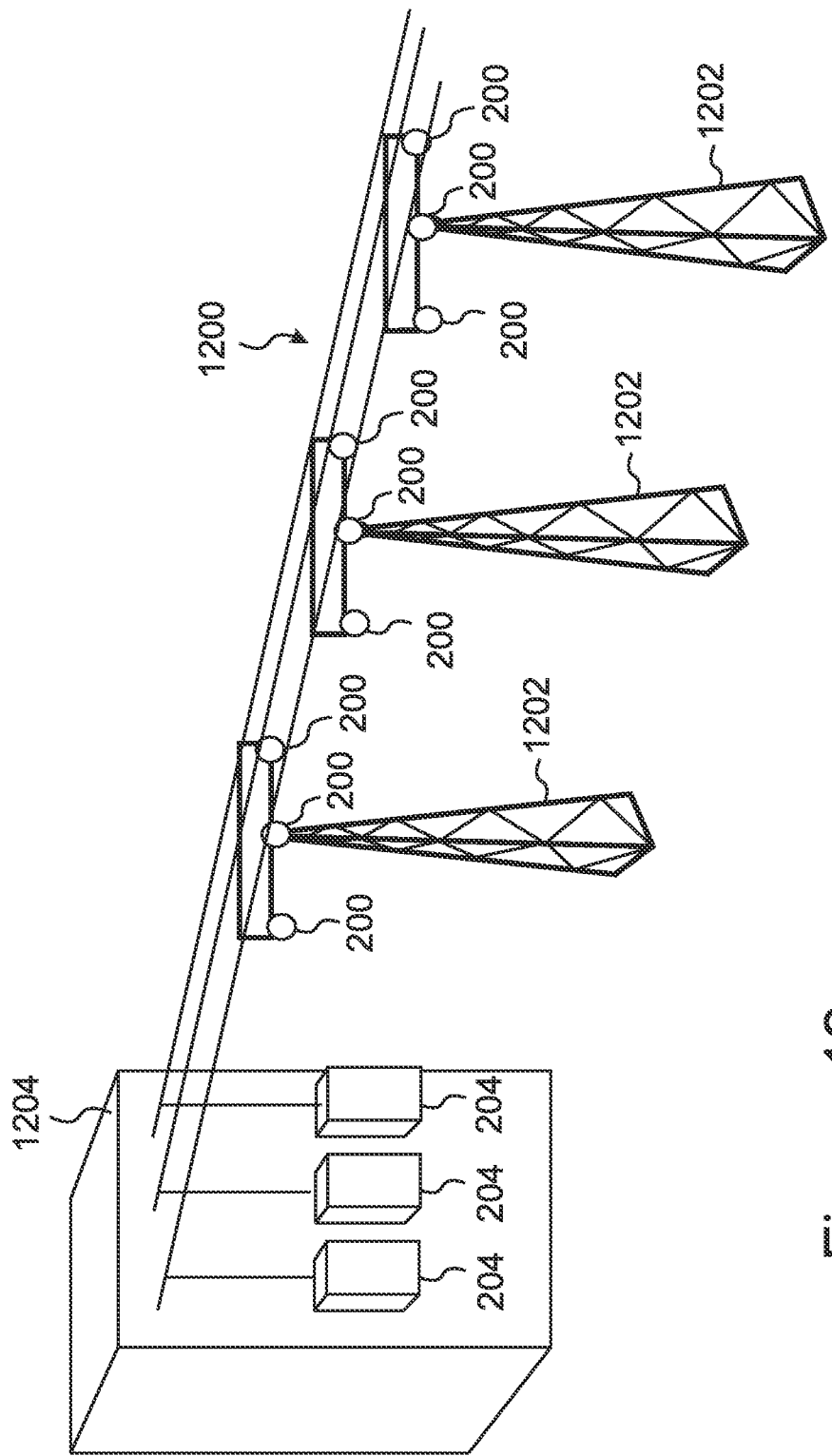
FIG. 12 illustrates application of the invention to monitoring of current leakage in power transmission lines.

FIG. 12 illustrates an embodiment in which the invention is applied to monitoring of current leakage in power lines 1200. In this embodiment, sensors 200 are located periodically along the power lines in groups of three, typically at the towers 1202 which support the power lines, with one sensor 200 of each group being associated with each of the three power lines 1200 carrying the three phases of power. A CSG 204 is associated with each of the power lines 1200, typically at a power substation 1204, and the sensors communicate by wired or wireless means with one or more control units (not shown) so as to report the current sensed at each location along the power lines 1200.

Another application of the present invention is for calibration of a current sensor, including a loop sensor. In this application, the system includes a receiver 202 and a CSG 204. The sensor is applied to an electrical circuit, the CSG 204 is used to impose a current calibration signal on the circuit, and the output of the sensor is directed to the receiver 202, which detects and distinguishes the calibration signal, and provides a calibration function for the sensor.

The foregoing description of the embodiments of the invention has been presented for the purposes of illustration and description. It is not intended to be exhaustive or to limit the invention to the precise form disclosed. Many modifications and variations are possible in light of this disclosure. It is intended that the scope of the invention be limited not by this detailed description, but rather by the claims appended hereto.

What is claimed is:

1. A self-calibrating system for measuring a quantity of electrical current flowing through an electrical conductor included in an electrical circuit, the system comprising:
    a calibration signal generator ("CSG"), configured for coupling to the electrical circuit, the CSG being able to at least one of draw current from and add current to the electrical conductor so as to impose an automatically repeated calibration signal including a time-varying current fluctuation of known strength and time variation pattern onto the current flowing through the electrical conductor;
    a current sensor which, when placed in sensory communication with the electrical conductor, produces a sensor output signal having a signal strength which is related to the quantity of electrical current flowing through the electrical conductor; and
    a receiver which is able to receive the sensor output signal, distinguish according to the known time variation pattern of the calibration signal a component of the sensor output signal which corresponds to the calibration signal, and calibrate the sensor output signal according to the known strength of the calibration signal so as to determine the quantity of current flowing through the electrical conductor.

2. The system of claim 1, wherein the electrical circuit includes an electrical outlet, and the CSG is configured for coupling to the circuit by connection of the CSG to the electrical outlet.

3. The system of claim 1, wherein the CSG is able to communicate bi-directionally with the receiver by at least one of wired and wireless means.

4. The system of claim 1, wherein the CSG is able to encode a message into the calibration signal and thereby convey the message to the receiver.

5. The system of claim 1, wherein the time-varying current fluctuation pattern of the calibration signal is synchronized to an AC voltage or current cycle of the electrical current flowing through the electrical conductor.

6. The system of claim 5, wherein the calibration signal is synchronized to begin near at least one of a maximum, a minimum, and a null-crossing of the AC cycle.

7. The system of claim 5, wherein the calibration signal has a duration which is less than one half of the AC voltage or current cycle.

8. The system of claim 1, wherein the calibration signal includes a current pulse.

9. The system of claim 8, wherein the current pulse has a duration of less than 10 msec.

10. The system of claim 1, wherein the calibration signal includes a pulse pattern having a total number of time slots in which current pulses can occur and a total number of current pulses which occur in some but not all of time slots, a threshold for detection of the current pulses being set by the receiver according to a ratio of the total number of current pulses divided by the total number of time slots.

11. The system of claim 1, wherein at least one of the CSG and the receiver is powered by the electrical circuit.

12. The system of claim 1, wherein the sensor is a magnetic field sensor which is able to sense a magnetic field generated by current flowing through a circuit breaker when the sensor is placed near the circuit breaker.

13. The system of claim 12, wherein the receiver is able to receive the sensor output signal from the magnetic field sensor through a flat, flexible cable which is able to extend through a gap between a closed cover or door of a circuit breaker enclosure containing the circuit breaker.

14. The system of claim 1, wherein a plurality of sensors is affixed to a sheet having dimensions which allow the sheet to be placed proximal to a plurality of conductors, thereby locating the sensors in proximity to the conductors.

15. The system of claim 14, wherein the conductors are cooperative with a plurality of circuit breakers, sheet can be affixed to a structure which is cooperative with the plurality of circuit breakers.

16. The system of claim 1, wherein a plurality of sheets, each having at least one sensor affixed thereto, can be placed proximal to a plurality of conductors so as to locate each of the plurality of sensors proximal to a respective conductor, intercommunication between the sheets of sensor output signals from the plurality of sensors being provided by at least one of physical contact between the sheets and an interconnecting cable between the sheets.

17. The system of claim 1, wherein the sensor includes a Hall-effect device.

18. The system of claim 1, wherein the sensor includes an electro-magnetic field concentrator.

19. The system of claim 1, wherein the system comprises a plurality of sensors which can be associated with a plurality of electrical conductors, and the receiver is configured for determining the quantities of current flowing through each of the plurality of electrical conductors.

20. The system of claim 19, wherein the plurality of electrical conductors are contained within an electrical cable or conduit.

21. The system of claim 19, wherein the plurality of electrical conductors is exceeded in number by the plurality of sensors, and the receiver is configured for determining an amplitude of an external magnetic field not produced by any of the plurality of electrical conductors, as well as determining the quantities of current flowing through each of the plurality of electrical conductors.

22. The system of claim 19, wherein the system comprises a plurality of CSG's.

23. The system of claim 22, wherein the plurality of CSG's are able to produce calibration signals which are distinguishable from each another.

24. The system of claim 23, wherein the calibration signals are distinguishable due to differences in at least one of polarity and timing.

25. The system of claim 23, wherein the calibration signals include pulse patterns, and the calibration signals are distinguishable from each other due to differences between their pulse patterns.

26. The system of claim 25, wherein the pulse patterns of the calibration signals are mutually distinguishable according to differences in at least one of:
   pulse widths;
   pulse timings;
   pulse repetition rates;
   pulse amplitude patterns; and
   pulse modulation frequencies.

27. The system of claim 19, wherein the receiver is able to determine detection sensitivities of at least one sensor to each of a plurality of electrical conductors which are proximal to the sensor.

28. The system of claim 19, wherein the receiver is able to calibrate a first sensor associated with a first branch circuit of the electrical circuit to which a CSG is not coupled by:
   using a calibration signal imposed on a second branch circuit to calibrate a primary sensor associated with a primary electrical conductor which supplies current to both the first branch circuit and the second branch circuit;
   determining an amplitude and timing of a current event occurring in the first branch circuit using the primary sensor;
   according to the timing of the current event, distinguishing a component of an output signal from the first sensor which corresponds to the current event; and
   using the determined amplitude of the current event to calibrate the output of the first sensor.

29. The system of claim 1, wherein the sensor output signal is not linearly proportional to the current over a range of quantities of electrical current, and the receiver is able to accumulate and maintain calibration data which enables calibration of the sensor output signal at a plurality of values within the range of quantities of electrical current.

30. The system of claim 1, wherein the sensor output signal is not uniform over a range of calibration signal repetition or modulation frequencies, and the receiver is able to accumulate and maintain calibration data which enables calibration of the sensor output signal at a plurality of values within the range of repetition or modulation frequencies.

31. The system of claim 1, further comprising a calibration signal isolator which is able to isolate the calibration signal from a remaining portion of the sensor output signal by subtracting the remaining portion from the sensor output signal, the calibration signal isolator being further able to amplify the isolated calibration signal so that it can be digitized with enhanced dynamic range.

32. The system of claim 1, wherein the receiver is able to store the calibration signal between repetitions.

33. The system of claim 1, wherein the receiver is able to average the calibration signal over a plurality of repetitions.

34. A self-calibrating method for measuring a quantity of electrical current driven by a current source through an electrical conductor included in an electrical circuit, the method comprising:
   imposing an automatically repeated calibration signal including a time-varying current fluctuation of known strength and time variation pattern onto the electrical current flowing through the electrical conductor by coupling a calibration signal generator ("CSG") to the electrical circuit, the CSG being able to at least one of draw current from and add current to the electrical conductor;
   placing a current sensor in sensory communication with the electrical conductor, the current sensor producing a sensor output signal having a signal strength which is related to the quantity of electrical current flowing through the electrical conductor;
   according to the known time variation pattern, distinguishing a component of the sensor output signal that corresponds to the calibration signal; and
   using the known strength of the calibration signal, calibrating the sensor output signal and determining the quantity of electrical current flowing through the electrical conductor.

35. The method of claim 34, further comprising:
   imposing automatically repeated, time-varying current fluctuations on each of a plurality of electrical conductors;
   placing at least one of a plurality of current sensors in sensory communication with each of the plurality of electrical conductors;
   calibrating the response of each of the plurality of sensors to each of the plurality of electrical conductors; and
   determining amounts of current flowing through each of the plurality of electrical conductors.

36. A system for calibrating an electrical current sensor, the electrical current sensor being able to generate a sensor output signal corresponding to a quantity of electrical current flowing through an electrical conductor included in an electrical circuit, the system comprising:
   a calibration signal generator ("CSG"), configured for coupling to the electrical circuit, the CSG being able to at least one of draw current from and add current to the electrical conductor so as to impose an automatically repeated calibration signal including a time-varying current fluctuation of known strength and time variation pattern onto the current flowing through the electrical conductor; and
   a receiver which is able to receive the sensor output signal, distinguish according to the known time variation pattern of the calibration signal a component of the sensor output signal which corresponds to the calibration signal, and calibrate the sensor output signal according to the known strength of the calibration signal.

* * * * *